(12) United States Patent
Sugahara et al.

(10) Patent No.: US 9,313,933 B2
(45) Date of Patent: Apr. 12, 2016

(54) POWER CONVERTER PERFORMING EVAPORATIVE COOLING OF A SWITCHING ELEMENT

(75) Inventors: Tetsuo Sugahara, Tokyo (JP); Tomohiro Kobayashi, Tokyo (JP); Ryosuke Nakagawa, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 48 days.

(21) Appl. No.: 14/349,346

(22) PCT Filed: Oct. 6, 2011

(86) PCT No.: PCT/JP2011/073102
§ 371 (c)(1),
(2), (4) Date: Apr. 3, 2014

(87) PCT Pub. No.: WO2013/051133
PCT Pub. Date: Apr. 11, 2013

(65) Prior Publication Data
US 2015/0049527 A1 Feb. 19, 2015

(51) Int. Cl.
*H05K 7/20* (2006.01)
*H01L 23/34* (2006.01)
(Continued)

(52) U.S. Cl.
CPC .............. *H05K 7/2089* (2013.01); *H01L 23/34* (2013.01); *H01L 23/427* (2013.01); *H01L 23/467* (2013.01); *H02M 1/32* (2013.01);
(Continued)

(58) Field of Classification Search
CPC . H02M 5/257; H02M 5/2573; H02M 5/2576; H05K 7/20; H05K 1/0201; H05K 7/20245; H01L 23/24
See application file for complete search history.

(56) References Cited

U.S. PATENT DOCUMENTS 5,195,577 A * 3/1993 Kameda et al. .......... 165/104.13
5,610,453 A * 3/1997 Smith ........................... 307/116
(Continued)

FOREIGN PATENT DOCUMENTS

CN   1051785 A   5/1991
CN   101533064 A   9/2009
(Continued)

OTHER PUBLICATIONS

The extended European Search Report issued on May 13, 2015, by the European Patent Office in corresponding European Application No. 11873735.2. (8 pages).
(Continued)

*Primary Examiner* — Harry Behm
*Assistant Examiner* — Peter Novak
(74) *Attorney, Agent, or Firm* — Buchanan Ingersoll & Rooney PC

(57) ABSTRACT

A power converter, which performs cooling of a switching element by using a boiling cooling apparatus that makes use of a boiling phenomenon of a coolant incorporated therein, includes a control unit to control an operation of the power converter based on a deviation between an element attachment surface temperature, which is a temperature of an attachment surface of the switching element, and a cooling apparatus intake air temperature. When the deviation between the element attachment surface temperature and the cooling apparatus intake air temperature exceeds a predetermined threshold, the control unit performs control of stopping the power converter.

17 Claims, 14 Drawing Sheets

(51) Int. Cl.
*H01L 23/467* (2006.01)
*H02M 1/32* (2007.01)
*H01L 23/427* (2006.01)
*H02M 5/293* (2006.01)
*H02M 7/537* (2006.01)
H02M 5/458 (2006.01)
H02M 7/5387 (2007.01)

(52) U.S. Cl.
CPC .............. *H02M 5/293* (2013.01); *H02M 7/537* (2013.01); *H05K 7/2029* (2013.01); *H05K 7/20936* (2013.01); H01L 2924/0002 (2013.01); H02M 5/4585 (2013.01); H02M 7/5387 (2013.01); H02M 2001/327 (2013.01); H02M 2005/2932 (2013.01)

(56) References Cited

U.S. PATENT DOCUMENTS

| | | | |
|---|---|---|---|
| 7,154,123 | B2 | 12/2006 | Kunisato et al. |
| 7,607,827 | B2 | 10/2009 | Karikomi et al. |
| 7,954,334 | B2 | 6/2011 | Sasaki et al. |
| 2008/0212345 | A1 | 9/2008 | Yamashita et al. |
| 2010/0111134 | A1 | 5/2010 | Matsumoto |

FOREIGN PATENT DOCUMENTS

| | | | |
|---|---|---|---|
| EP | 1193756 | A1 * | 4/2002 |
| JP | 61-61893 | U | 4/1986 |
| JP | 4-285470 | A | 10/1992 |
| JP | 5-49266 | A | 2/1993 |
| JP | 5-75284 | A | 3/1993 |
| JP | 7-194094 | A | 7/1995 |
| JP | 8-126337 | A | 5/1996 |
| JP | 10-210790 | A | 8/1998 |
| JP | 2001-186775 | A | 7/2001 |
| JP | 2002-134664 | A | 5/2002 |
| JP | 2003-18861 | A | 1/2003 |
| JP | 2004-257821 | A | 9/2004 |
| JP | 2005-130568 | A | 5/2005 |
| JP | 2005-184977 | A | 7/2005 |
| JP | 2005-259832 | A | 9/2005 |
| JP | 2005-269832 | A | 9/2005 |
| JP | 2006-271136 | A | 10/2006 |
| JP | 2006-304566 | A | 11/2006 |
| JP | 2008-57851 | A | 3/2008 |
| JP | 2008-61476 | A | 3/2008 |
| JP | 2008-241232 | A | 10/2008 |
| JP | 2009-33872 | A | 2/2009 |
| JP | 2009-284597 | A | 12/2009 |
| JP | 2010-213539 | A | 9/2010 |

OTHER PUBLICATIONS

International Search Report (PCT/ISA/210) mailed on Dec. 27, 2011, by the Japanese Patent Office as the International Searching Authority for International Application No. PCT/JP2011/073102.

Written Opinion (PCT/ISA/237) mailed on Dec. 27, 2011, by the Japanese Patent Office as the International Searching Authority for International Application No. PCT/JP2011/073102.

Office Action issued in Chinese Patent Office Oct. 8, 2015 in corrdesponding Chinese Application No. 201180074018.0 (25 pages).

Office Action mailed Nov. 20, 2015 by the Korean Intellectual Property Office in corresponding Korean Patent Application No. 10-2014-7011654 (9 pages).

* cited by examiner

POWER CONVERTER PERFORMING EVAPORATIVE COOLING OF A SWITCHING ELEMENT

FIELD

The present invention relates to a power converter configured to be coolable by a cooling apparatus of a boiling cooling system.

BACKGROUND

A power converter causes a switching element such as a MOSFET or an IGBT to perform a switching operation and performs power conversion. When the power conversion is performed, a switching loss occurs according to the switching operation of the switching element. When the switching loss occurs, the temperature of the switching element (hereinafter referred to as "element temperature") rises. Therefore, a cooling apparatus for suppressing the rise in the element temperature is indispensable.

In general, the cooling apparatus includes fins for cooling heat generation of an element. However, to further improve a cooling ability, there are many cooling apparatuses employing a boiling cooling system that makes use of a boiling phenomenon of a coolant incorporated therein.

In the cooling apparatus by the boiling cooling system (hereinafter referred to as "boiling cooling apparatus"), the coolant is filled inside the fins. The coolant boiled and vaporized by the heat generation is cooled by cooling air via a condenser, whereby the element is cooled.

The boiling cooling apparatus is usually fully filled with the coolant (e.g., water or flourinert). Pressure (steam pressure) obtained when the coolant vaporizes is about 0.3 atm at the normal temperature.

On the other hand, in the boiling cooling apparatus, it is known that fine holes are opened in a portion of the condenser under a normal environment of use. When the fine holes are opened, whereas the inside of the condenser is 0.3 atm, the outside of the condenser is 1 atm. Therefore, importance of managing mixing of the air in the atmosphere into the condenser is pointed out (e.g., Patent Literature 1).

Note that, in the boiling cooling apparatus described in Patent Literature 1 (in the literature, disclosed as "boiling cooling thyristor apparatus"), when the air, which is a non-condensable gas in the atmosphere, mixes in the condenser, a temperature difference occurs between upper and lower parts of the condenser. Therefore, the temperature difference is detected using a plurality of temperature sensors provided on the peripheral wall on the surface of the condenser. Cooling performance of the boiling cooling apparatus is grasped based on information concerning the detected temperature difference.

CITATION LIST

Patent Literature

Patent Literature 1: Japanese Patent Application Laid-Open No. H4-285470

SUMMARY

Technical Problem

In the above explanation, the cooling performance of the boiling cooling apparatus is deteriorated by the mixing of the air in the condenser. However, the deterioration in the cooling performance is caused by a factor other than the mixing of the air in the condenser, for example, clogging of cooling fins. Therefore, in the method described in Patent Literature 1, there is a problem in that, although the cooling performance deterioration due to the air mixing in the condenser can be detected, performance deterioration due to other factors cannot be effectively detected.

The present invention has been devised in view of the above and it is an object of the present invention to provide a power converter including a boiling cooling apparatus that can effectively detect cooling performance deterioration due to air mixing in a condenser as well as other factors.

Solution to Problem

The present invention is directed to a power converter that achieves the object. The power converter is converting input direct-current power or alternating-current power into desired alternating-current power according to a switching operation of a switching element to output the desired alternating-current power, and perform cooling of the switching element by using a cooling apparatus that makes use of a boiling phenomenon of a coolant incorporated therein. The power converter includes a control unit controlling an operation of the power converter based on a deviation between a temperature of the switching element or an attachment surface of the switching element and a temperature of cooling air sucked by the cooling apparatus, wherein the control unit performs control of stopping the power converter when the deviation exceeds a predetermined threshold.

Advantageous Effects of Invention

The present invention produces an effect that it is possible to provide the power converter that can effectively detect cooling performance deterioration due to factors such as air mixing in a condenser and clogging.

DESCRIPTION OF EMBODIMENTS

Power converters according to embodiments of the present invention are explained below with reference to the accompanying drawings. Note that the present invention is not limited by the embodiments explained below.

First Embodiment

Figure 1:
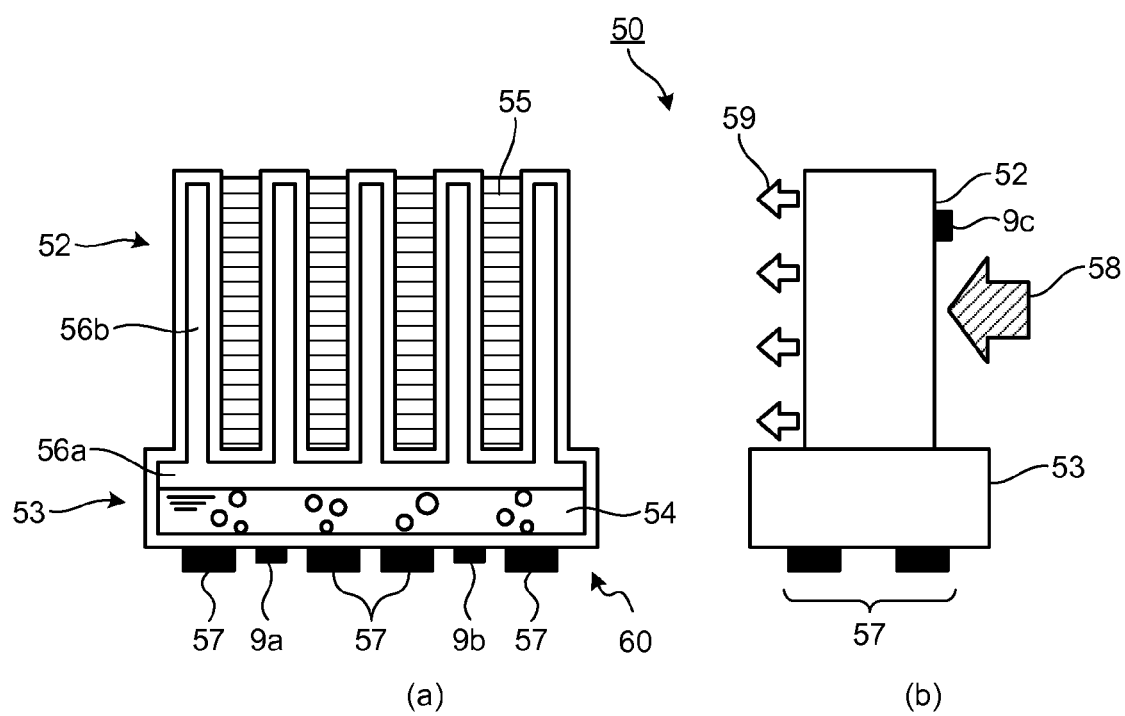
FIG. 1 is a schematic diagram of a configuration example of a cooling apparatus suitably used in a power converter according to a first embodiment.

FIG. 1 is a schematic diagram of a configuration example of a cooling apparatus suitably used in a power converter according to a first embodiment of the present invention. (a) is a front view and (b) is a side view. A cooling apparatus 50 shown in FIG. 1 is a cooling apparatus by a boiling cooling system (a boiling cooling apparatus). The cooling apparatus 50 includes a condenser 52 functioning as a heat radiating unit, an evaporator 53 functioning as a heat absorbing unit, a coolant 54, and fins 55. Switching elements 57 provided in a below-mentioned power converter and configuring a main circuit are attached in contact with the evaporator 53 (in FIG. 1, a configuration in which the switching elements 57 are attached in a lower part of the evaporator 53 is shown). The coolant 54 is encapsulated in a coolant chamber 56a provided on the inside of the evaporator 53.

On an attachment surface 60 for the switching elements 57, a temperature sensor 9a (e.g., for a converter circuit) and a temperature sensor 9b (e.g., for an inverter circuit) for measuring the temperature of the switching elements 57 or the temperature near the switching elements 57 are provided. That is, the temperature sensors 9a and 9b are arranged as temperature sensors for measuring the temperature of the switching element attachment surface to indirectly measure the temperature of the switching elements. In addition to the temperature sensors 9a and 9b, a temperature sensor 9c for measuring an intake air temperature of the condenser 52 is provided in an upper part of the condenser 52. Note that the temperature sensor 9c can be attached in an arbitrary position where the temperature sensor 9c can measure the intake air temperature of the condenser 52.

When the switching elements 57 generates heat, the temperature of the coolant 54 rises. When the temperature of the coolant 54 reaches a certain temperature, the coolant 54 boils. The evaporated coolant 54 intrudes into a coolant chamber 56b provided on the inside of the condenser 52. Note that, depending on the configuration of a cooling apparatus, an evaporate coolant intrudes into the inside of fins as well. Heat generated by the heat generation of the switching elements 57 is radiated by the fins 55. Note that, as shown in FIG. 1, if cooling air 58 is ventilated to the fins 55, it is possible to accelerate movement of hot air 59 passing through the condenser 52 and realize a cooling apparatus having high cooling efficiency.

Figure 2:
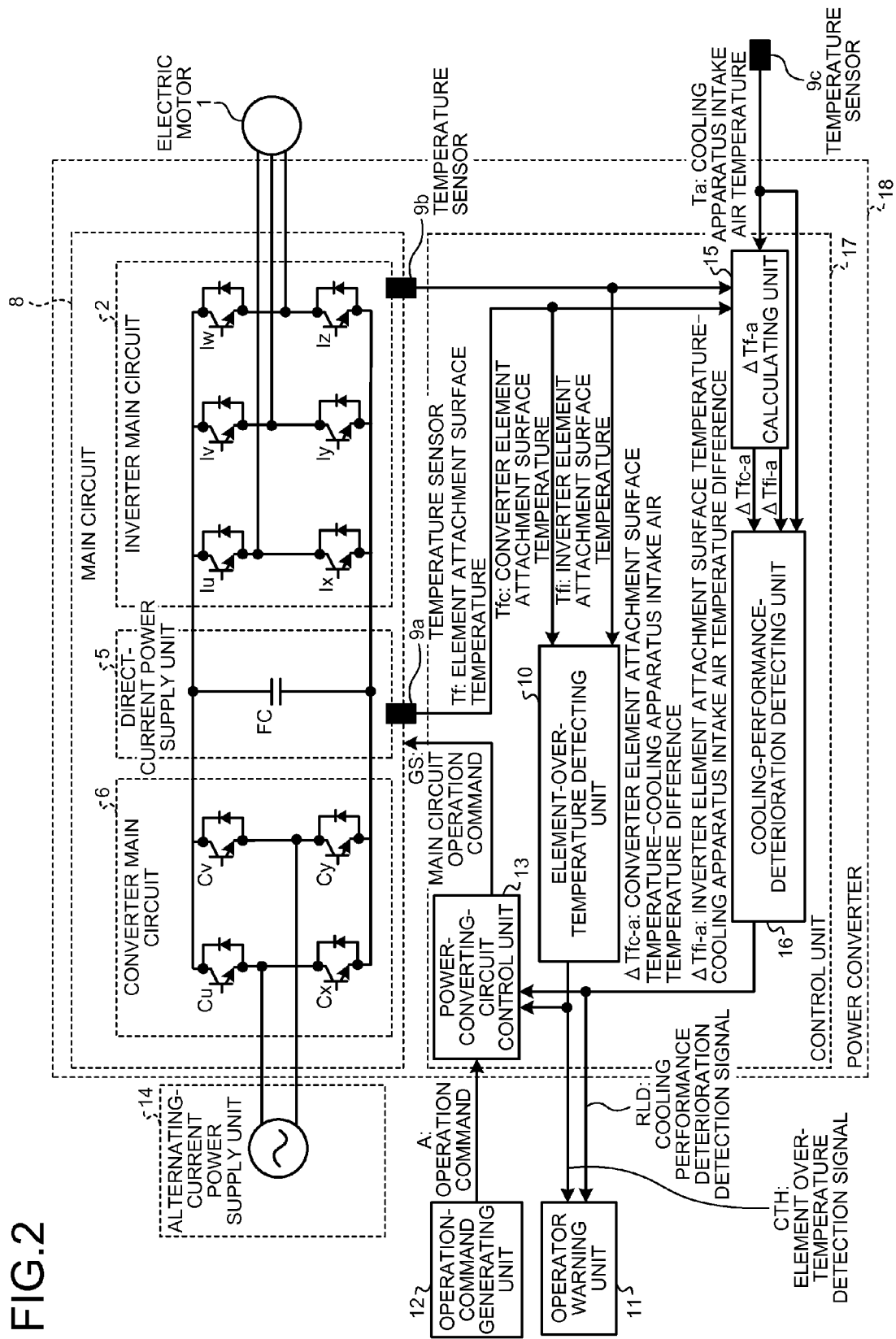
FIG. 2 is a diagram of the configuration of the power converter according to the first embodiment.

FIG. 2 is a diagram of the configuration of the power converter according to the first embodiment of the present invention. A power converter 18 includes a main circuit 8 and a control unit 17. An alternating-current power supply unit 14 is connected to an input end of the main circuit 8. An electric motor (e.g., an induction motor or a synchronous motor) 1 that operates with a three-phase alternating current is connected to an output end of the main circuit 8.

The main circuit 8 includes an inverter main circuit 2, a direct-current power supply unit 5, and a converter main circuit 6.

The converter main circuit 6 includes circuit units (legs) to which positive side arms (e.g., Iu in a U phase) including switching elements Iu, Iv, and Iw and negative side arms (e.g., Ix in the U phase) including switching elements Ix, Iy, and Iz are respectively connected in series. That is, in the inverter main circuit 2, a three-phase bridge circuit including three sets (for a U phase, a V phase, and a W phase) of legs is configured. Connection points of the positive side arms and the negative side arms (middle points of the legs) form alternating-current terminals of the inverter main circuit 2 and are connected to the electric motor 1.

The direct-current power supply unit 5 is a configuration unit that retains direct-current power. The direct-current power supply unit 5 is configured by a filter capacitor FC provided between direct-current buses in an example shown in the figure.

The converter main circuit 6 includes circuit units to which positive side arms including switching elements Cu and Cv and negative side arms including switching elements Cx and Cy are respectively connected in series. That is, in the converter main circuit 6, a single-phase bridge circuit including two sets of legs is configured. Connection points of the positive side arms and the negative side arms (middle points of the legs) form alternating-current terminals of the converter main circuit 6 and are connected to the alternating-current power supply unit 14.

The control unit 17 includes an element-over-temperature detecting unit 10, a power-converting-circuit control unit 13, a temperature-difference calculating unit 15 (in FIG. 1, described as "ΔTf–a calculating unit"; note that the meaning of "ΔTf–a" is explained below), and a cooling-performance-deterioration detecting unit 16. On the outside of the control unit 17, an operator warning unit 11 and an operation-command generating unit 12 are provided.

Figure 3:
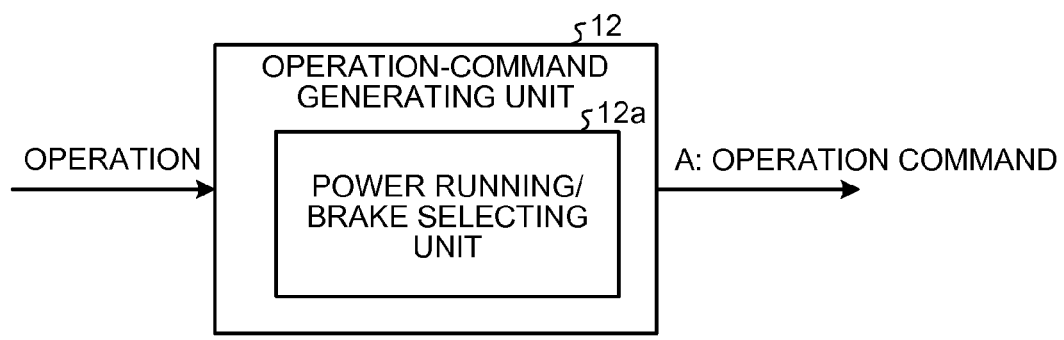
FIG. 3 is a diagram of a detailed configuration of an operation-command generating unit.
Figure 4:
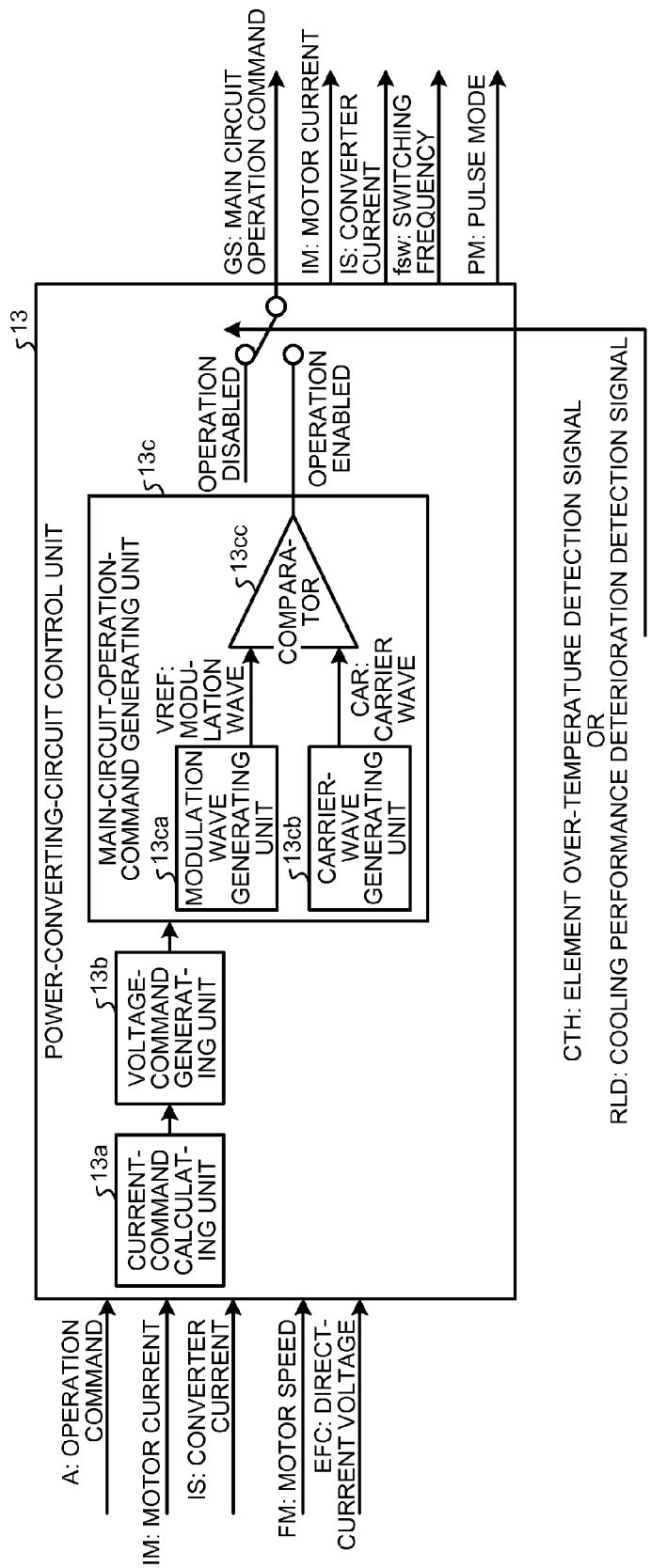
FIG. 4 is a diagram of a detailed configuration of a power-converting-circuit control unit.
Figure 5:
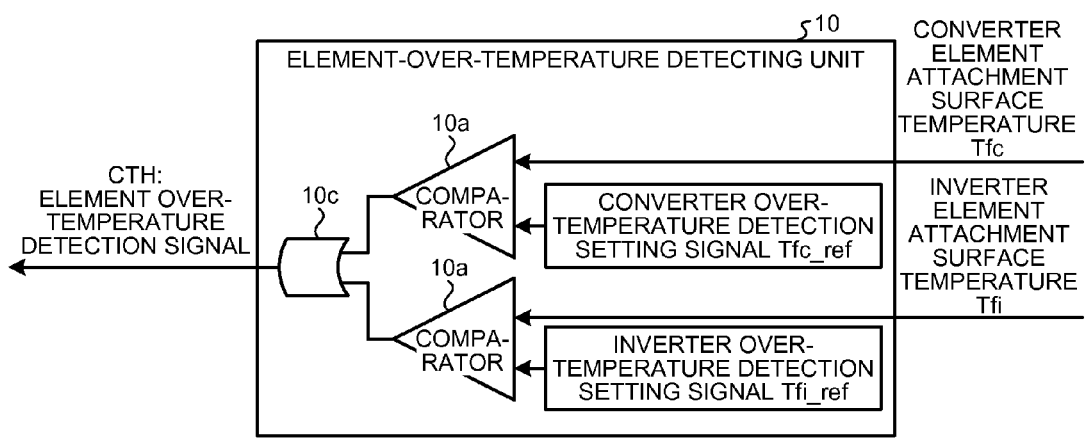
FIG. 5 is a diagram of a detailed configuration of an element-over-temperature detecting unit.
Figure 6:
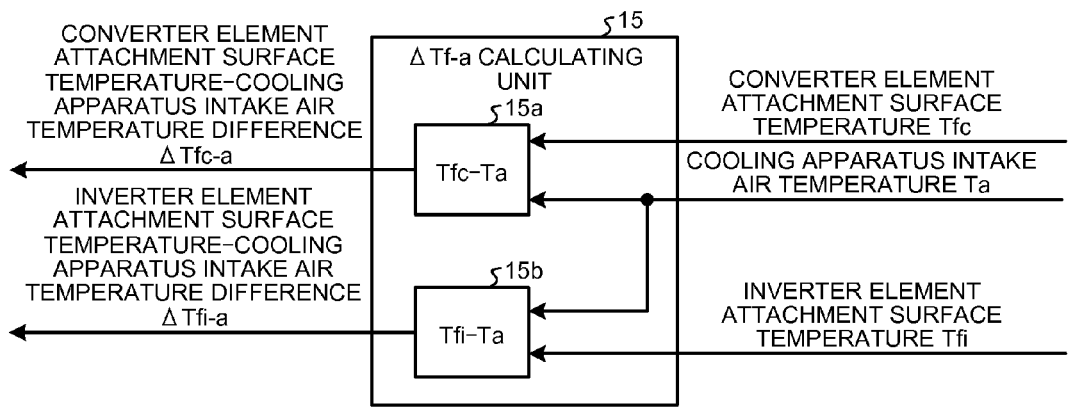
FIG. 6 is a diagram of a detailed configuration of a $\Delta Tf$–a calculating unit.
Figure 7:
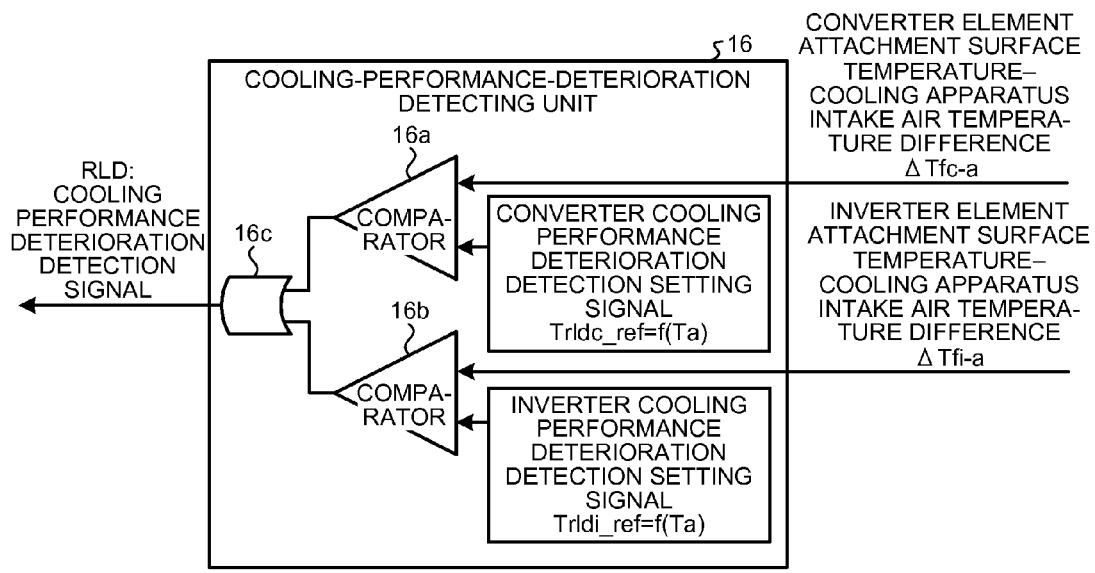
FIG. 7 is a diagram of a detailed configuration of a cooling-performance-deterioration detecting unit.
Figure 8:
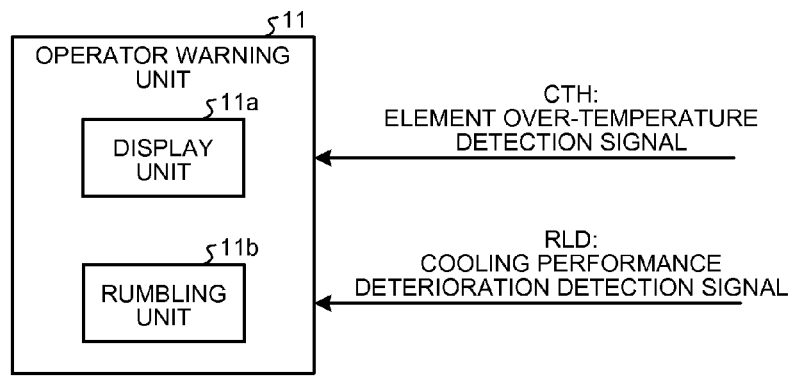
FIG. 8 is a diagram of a detailed configuration of an operator warning unit.

The configurations and the operations of the units included in the control unit 17 and the configurations and the functions of the units arranged in the periphery of the control unit 17 are explained with reference to FIG. 3 to FIG. 8. FIG. 3 is a diagram of a detailed configuration of the operation-command generating unit 12. FIG. 4 is a diagram of a detailed configuration of the power-conversion-circuit control unit 13. FIG. 5 is a diagram of a detailed configuration of the element-over-temperature detecting unit 10. FIG. 6 is a diagram of a detailed configuration of the ΔTf–a calculating unit 15. FIG. 7 is a diagram of a detailed configuration of the cooling-performance-deterioration detecting unit 16. FIG. 8 is a diagram of a detailed configuration of the operator warning unit 11.

The operation-command generating unit 12 includes, as shown in FIG. 3, a power running/brake selecting unit 12a.

The power running/brake selecting unit 12a determines whether operation (notch operation) by an operator is a power running instruction or a brake instruction and outputs a result of the determination to the power-converting-circuit control unit 13 as an operation command A.

The power-converting-circuit control unit 13 includes, as shown in FIG. 4, a current-command calculating unit 13a, a voltage-command generating unit 13b, and a main-circuit-operation-command generating unit 13c. An operation command A, a motor current IM, a converter current IS, a motor speed FM, and a direct-current voltage EFC are input to the power-converting-circuit control unit 13. The motor current IM is an electric current flowing to the electric motor 1. The converter current IS is an electric current flowing out from and flowing into the converter main circuit 6. The motor speed FM is the speed of the electric motor 1. The direct-current voltage EFC is the voltage of the filter capacitor FC included in the direct-current power supply unit 5. All of these electrical quantities and physical quantities are detected by sensors (not shown in FIG. 2) arranged in necessary places of the configuration shown in FIG. 2.

The current-command calculating unit 13a calculates, using as appropriate the operation command A, the motor current IM, the converter current IS, the motor speed FM, and the direct-current voltage EFC, a command for an electric current that should be fed to the electric motor 1 (or necessary torque that should be output by the electric motor 1) and outputs the current command or the torque command to the voltage-command generating unit 13b at the next stage.

The voltage-command generating unit 13b outputs, based on the current command or the torque command output from the current-command calculating unit 13a, a voltage command, which is a command value of a voltage that should be applied to the electric motor 1. Note that detailed configurations of the current-command calculating unit 13a and the voltage-command generating unit 13b are publicly known. Therefore, more detailed explanation of the detailed configurations is omitted.

The main-circuit-operation-command generating unit 13c outputs, based on the voltage command output from the voltage-command generating unit 13b, a signal (a switching command) for subjecting the switching elements (Iu to Iz) of the inverter main circuit 2 to ON/OFF control and a signal (a switching command) for subjecting the switching elements (Cu, Cv, Cx, and Cy) of the converter main circuit 6 to ON/OFF control to the inverter main circuit 2 and the converter main circuit 6 as a main circuit operation command GS. However, as shown in the figure, when a signal generated when an over-temperature of the switching elements is detected (an element over-temperature detection signal CTH) or a signal generated when deterioration in cooling performance is detected (a cooling performance deterioration detection signal RLD) is input, the main circuit operation is disabled and the main circuit operation command GS is not output. Besides the main circuit operation command GS, information such as a switching frequency fsw, a pulse mode PM, a motor current IM, and a converter current IS is output from the power-converting-circuit control unit 13. As shown in the figure, the main-circuit-operation-command generating unit 13c can be configured by combining a modulation-wave generating unit 13ca, a carrier-wave generating unit 13cb, a comparator 13cc, and the like. Note that a detailed configuration of the main-circuit-operation-command generating unit 13c is publicly-known. Therefore, more detailed explanation of the detailed configuration is omitted.

The element-over-temperature detecting unit 10 includes, as shown in FIG. 5, comparators 10a and 10b and an OR circuit 10c. A converter element attachment surface temperature Tfc detected by the temperature sensor 9a and an internally-generated converter over-temperature detection setting signal Tfc-ref are input to the comparator 10a. An inverter element attachment surface temperature Tfi detected by the temperature sensor 9b and an internally-generated inverter over-temperature detection setting signal Tfi_ref are input to the comparator 10b. When the converter element attachment surface temperature Tfc exceeds the converter over-temperature detection setting signal Tfc_ref, the comparator 10a detects an over-temperature of converter elements and outputs a detected signal to the OR circuit 10c. Similarly, when the inverter element attachment surface temperature Tfi exceeds the inverter over-temperature detection setting signal Tfi_ref, the comparator 10b detects an over-temperature of inverter elements and outputs a detected signal to the OR circuit 10c. The OR circuit 10c performs an OR operation of the comparators 10a and 10b and outputs an operation result as the element over-temperature detection signal CTH. That is, when at least one of the converter element attachment surface temperature Tfc and the inverter element attachment surface temperature Tfi exceeds a detection threshold, the element-over-temperature detecting unit 10 outputs the over-temperature detection signal CTH indicating to that effect. As shown in FIG. 2, the generated element over-temperature detection signal CTH is an input signal to the power-converting-circuit control unit 13 and the operator warning unit 11.

The $\Delta Tf-a$ calculating unit 15 includes, as shown in FIG. 6, a calculating unit (in FIG. 6, described as "Tfc–Ta") 15a configured to calculate a signal representing a temperature difference on a converter main circuit side (a converter main circuit side temperature difference signal; in FIG. 6, described as "$\Delta Tfc-a$") and a calculating unit (in FIG. 6, described as "Tfi–Ta") 15b configured to calculate a signal representing a temperature difference on an inverter main circuit side (an inverter main circuit side temperature difference signal; in FIG. 6, described as "$\Delta Tfi-a$"). The converter element attachment surface temperature Tfc, the inverter element attachment surface temperature Tfi, and a cooling apparatus intake air temperature Ta detected by the temperature sensor 9c are input to the $\Delta Tf-a$ calculating unit 15. The Tfc–Ta calculating unit 15a calculate a difference value (a deviation) between the converter element attachment surface temperature Tfc and the cooling apparatus intake air temperature Ta and outputs a result of the calculation as the converter element attachment surface temperature-cooling apparatus intake air temperature difference $\Delta Tfc-a$. The Tfi–Ta calculating unit 15b calculates a difference value (a deviation) between the inverter element attachment surface temperature Tfi and the cooling apparatus intake air temperature Ta and outputs a result of the calculation as the inverter element attachment surface temperature-cooling apparatus intake air temperature difference $\Delta Tfi-a$. Note that, as shown in FIG. 1, the converter element attachment surface temperature-cooling apparatus intake air temperature difference $\Delta Tfc-a$ and the inverter element attachment surface temperature-cooling apparatus intake air temperature difference $\Delta Tfi-a$ generated as explained above are input signals to the cooling-performance-deterioration detecting unit 16.

The cooling-performance-deterioration detecting unit 16 includes, as shown in FIG. 7, comparators 16a and 16b and an OR circuit 16c. The converter element attachment surface temperature-cooling apparatus intake air temperature difference $\Delta Tfc-a$ generated by the $\Delta Tf-a$ calculating unit 15 and a converter cooling performance deterioration detection setting signal Trldc_ref internally generated as a function (f(Ta)) of the cooling apparatus intake air temperature Ta are input to the comparator 16a. The inverter element attachment surface temperature-cooling apparatus intake air temperature difference ΔTfi–a generated by the ΔTf–a calculating unit 15 and an inverter cooling performance deterioration detection setting signal Trldi_ref internally generated as a function (f(Ta)) of the cooling apparatus intake air temperature Ta in the same manner as the converter side are input to the comparator 16b. When the converter element attachment surface temperature-cooling apparatus intake air temperature difference ΔTfc–a exceeds the converter cooling performance deterioration detection setting signal Trldc_ref, the comparator 16a detects deterioration in cooling performance on the converter main circuit side and outputs a detected signal to the OR circuit 16c. Similarly, when the inverter element attachment surface temperature-cooling apparatus intake air temperature difference ΔTfi–a exceeds the inverter cooling performance deterioration detection setting signal Trldi_ref, the comparator 16b detects deterioration in cooling performance on the inverter main circuit side and outputs a detected signal to the OR circuit 16c. The OR circuit 16c performs an OR operation of the comparators 16a and 16b and outputs an operation result as the cooling performance deterioration detection signal RLD. That is, when at least one of the converter element attachment surface temperature-cooling apparatus intake air temperature difference ΔTfc–a and the inverter element attachment surface temperature-cooling apparatus intake air temperature difference ΔTfi–a exceeds a detection threshold, the cooling-performance-deterioration detecting unit 16 outputs the cooling performance deterioration detection signal RLD indicating to that effect. Note that, as shown in FIG. 2, the cooling performance deterioration detection signal RLD generated as explained above is an input signal to the power-converting-circuit control unit 13.

The operator warning unit 11 includes, as shown in FIG. 8, a display unit 11a and a rumbling unit 11b. The display unit 11a is a component including a function of displaying to a user such as the operator an abnormality of the inverter main circuit 2, the converter main circuit 6, the cooling apparatus 50, and the like. The rumbling unit 11b is a component including a function of converting abnormality information of the inverter main circuit 2, the converter main circuit 6, the cooling apparatus 50, and the like into sound and calling attention of the user such as the operator. The functions of the units are executed based on the element over-temperature detection signal CTH output from the element over-temperature detecting unit 10 and the cooling performance deterioration detection signal RLD output from the cooling-performance-deterioration detecting unit 16.

Figure 9:
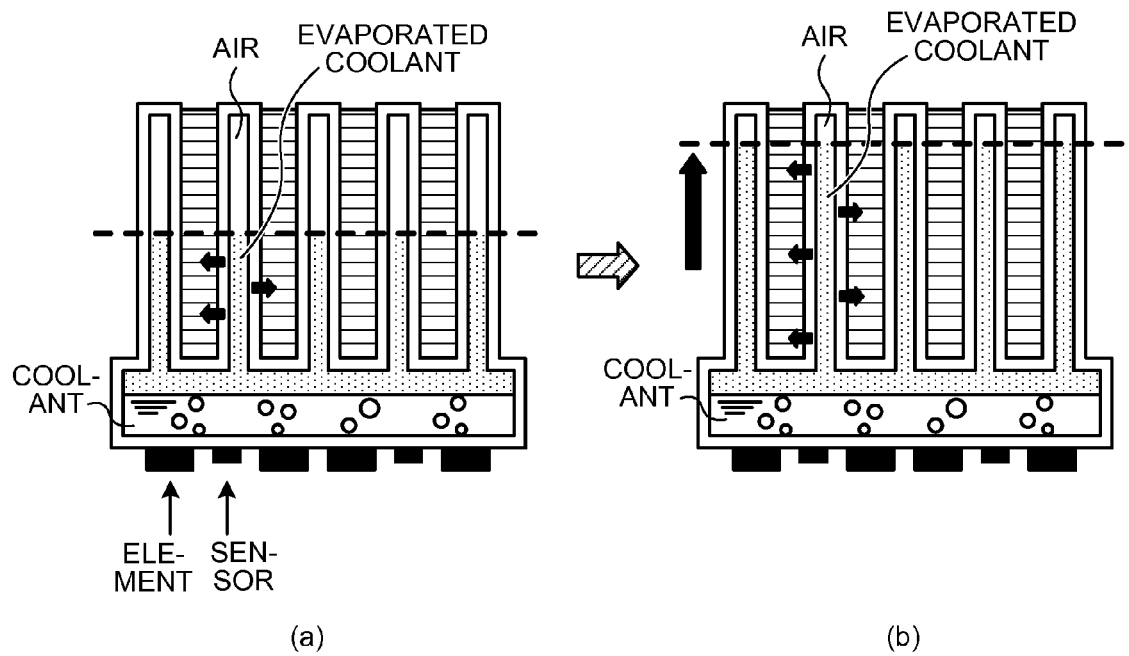
FIG. 9 is a diagram for explaining the operation of the cooling apparatus at high temperature time or at high heat generation time.

FIG. 9 is a diagram for explaining the operation of the cooling apparatus at high temperature time or at high heat generation time. Both FIG. 9(a) and FIG. 9(b) indicate a state in which the air is mixed in the cooling apparatus. More specifically, FIG. 9(a) shows a state in which the elements do not generate heat. FIG. 9(b) shows a high temperature state (the ambient temperature is high) or a high heat generation state.

As explained in the section of the background art, when fine holes are opened in the condenser because of corrosion or the like, whereas the inside of the condenser is 0.3 atm (when the coolant is a flourinert), the outside of the condenser is 1 atm. Therefore, the air is mixed in the inside of the condenser. Because the air is lighter than gas of the coolant, the air occupies an upper part of the condenser. Therefore, the boiled coolant can be present only below the air. The upper part where the air is present has cooling performance equivalent to cooling performance obtained when the condenser is absent. The performance of the cooling apparatus is deteriorated (see FIG. 9(a)).

On the other hand, even in an air mixed state shown in FIG. 9(a), the influence due to the deterioration in the cooling performance is small at the high temperature time or at the high heat generation time. This is because, for example, when the ambient temperature is high, because a steam quantity of the coolant is large, as shown in FIG. 9(b), the air occupying the upper part of the condenser is compressed and the volume of the air decreases. As a result, at the high temperature time, the deterioration in the cooling performance is suppressed.

Even when the ambient temperature is not high, at the high heat generation time (when a heat value of the elements is large), the steam quantity of the coolant increases according to an increase in the heat value of the elements. Therefore, the air occupying the upper part of the condenser is compressed and the volume of the air decreases. As a result, at the high heat generation time, as at the high temperature time, the deterioration in the cooling performance is suppressed.

Figure 10:
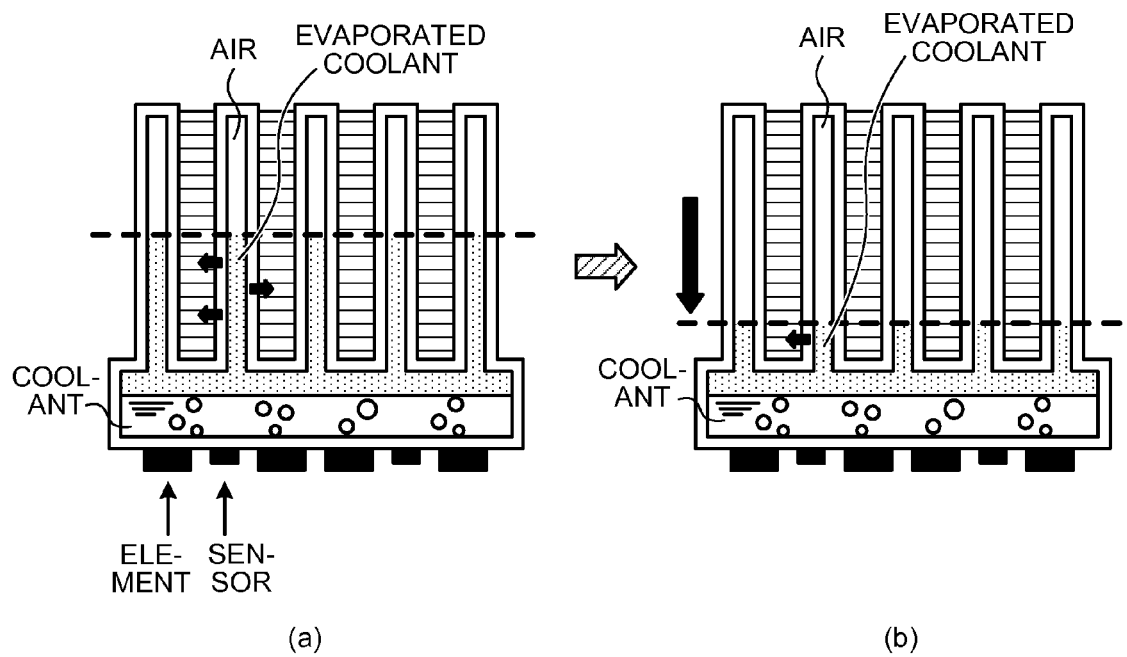
FIG. 10 is a diagram for explaining the operation of the cooling apparatus during low temperature and during low heat generation.

On the other hand, FIG. 10 is a diagram for explaining the operation of the cooling apparatus at low temperature time and at low heat generation time. FIG. 10(a) is reproduction of FIG. 9(a). FIG. 10(b) shows a low ambient temperature state (a low temperature state) and a low heat generation state (the heat value of the elements is small).

At the low temperature time, because the ambient temperature is low, the steam quantity of the coolant is small. Further, when the heat value of the elements is small, the steam quantity of the coolant does not increase. Therefore, as shown in FIG. 10(b), the volume occupied by the air is large compared with the volume at the high temperature time. That is, at the low temperature time and the low heat generation time, the deterioration in the cooling performance is large and stress on the elements is large.

Figure 11:
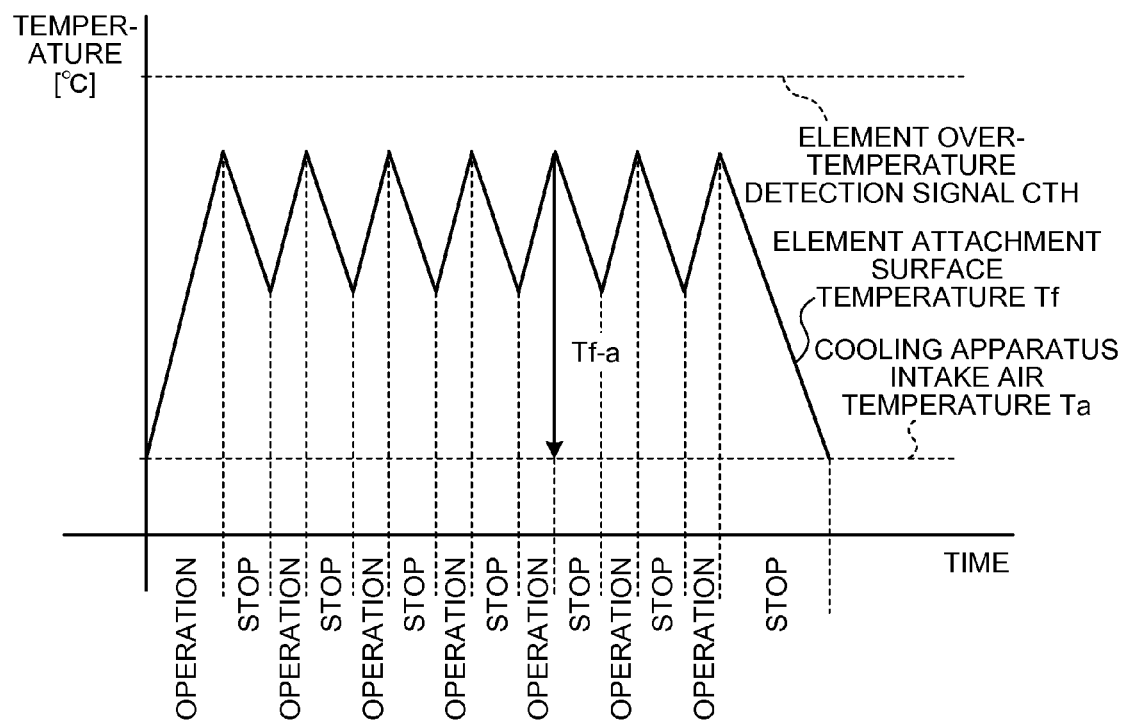
FIG. 11 is a diagram of a transition example of an element attachment surface temperature during the operation of the power converter.

A heat cycle of the power converter is explained. FIG. 11 is a diagram of a transition example of an element attachment surface temperature during the operation of the power converter. In FIG. 11, a waveform of a solid line part represents the element attachment surface temperature Tf. A broken line in a lower part of two broken lines drawn in parallel to a time axis represents the cooling apparatus intake air temperature Ta (the output of the temperature sensor 9c; see FIG. 2). A broken line in an upper part represents the element over-temperature detection signal CTH (the output of the element-over-temperature detecting unit 10; see FIG. 2 and FIG. 5).

For example, in the case of a power converter for railway car use, control for repeating an operation and a stop shown in FIG. 11 is performed. As a result, the element attachment surface temperature Tf repeats triangular wave-like fluctuation shown in FIG. 11 in which the element attachment surface temperature Tf increases during the operation and decreases during the stop. Such a heat cycle is an example of a cycle from a departure from a certain station until a stop at the next station. Such a heat cycle is repeated many times in a service in one day. That is, in the case of the power converter for the railway car use, switching elements mounted on the power converter are placed under a harsh operation environment. Note that, in the power converter in this embodiment, the temperature difference (Tf–a) between the element attachment surface temperature Tf and the cooling apparatus intake air temperature Ta is detected. This processing is executed by the Tf–a calculating unit 15 as explained above (see FIG. 2 and FIG. 6).

The operation of the power converter according to the first embodiment is explained. The main circuit operation command GS is output from the power-converting-circuit control unit 13 located at the last stage of the control unit 17 (see FIG. 2 and FIG. 4). The main circuit operation command GS includes an operation command for subjecting the switching elements (Iu to Iz) of the inverter main circuit 2 to ON/OFF control and an operation command for subjecting the switching elements (Cu, Cv, Cx, and Cy) of the converter main circuit 6 to ON/OFF control. The converter main circuit 6 converts, based on the main circuit operation command GS output from the power-converting-circuit control unit 13, alternating-current power supplied from the alternating-current power supply unit 14 into desired direct-current power and supplies the direct-current power to the direct-current power supply unit 5. The inverter main circuit 2 converts, based on the main circuit operation command GS output from the power-converting-circuit control unit 13, direct-current power supplied from the direct-current power supply unit 5 into three-phase alternating-current power having variable amplitude and a variable frequency and supplies the three-phase alternating-current power to the electric motor 1.

When the control explained above is performed, naturally, the switching elements (Iu to Iz) of the inverter main circuit 2 and the switching elements (Cu, Cv, Cx, and Cy) of the converter main circuit 6 generate heat and the temperature of the elements rises. The element-over-temperature detecting unit 10 determines whether the converter element attachment surface temperature Tfc detected by the temperature sensor 9a exceeds the converter over-temperature detection setting signal Tfc_ref to thereby detect an over-temperature of the converter elements. The element-over-temperature detecting unit 10 determines whether the inverter element attachment surface temperature Tfi exceeds the inverter over-temperature detection setting signal Tfi_ref to thereby detect an over-temperature of the inverter elements. When the element-over-temperature detecting unit 10 detects the over-temperature of one of the converter elements and the inverter elements, the element-over-temperature detecting unit 10 generates the element over-temperature detection signal CTH and outputs the element over-temperature detection signal CTH to the operator warning unit 11 and the power-converting-circuit control unit 13. When the element over-temperature detection signal CTH is input, the operator warning unit 11 notifies the user such as the operator of the over-temperature of the switching elements using a display function or a rumbling function. When the element over-temperature detection signal CTH is input, the power-converting-circuit control unit 13 interrupts the output of the main circuit operation command GS and stops the operation of the inverter main circuit 2 and the converter main circuit 6.

Cooling performance deterioration detection processing for the cooling apparatus is performed together with the element over-temperature detection processing. The cooling-performance-deterioration detecting unit 16 determines whether the converter element attachment surface temperature-cooling apparatus intake air temperature difference ΔTfc–a exceeds the converter cooling performance deterioration detection setting signal Trldc_ref to thereby detect deterioration in converter cooling performance. The cooling-performance-deterioration detecting unit 16 determines whether the inverter element attachment surface temperature-cooling apparatus intake air temperature difference ΔTfi–a exceeds the inverter cooling performance deterioration detection setting signal Trldi_ref to thereby detect deterioration in inverter cooling performance. When the cooling-performance-deterioration detecting unit 16 detects deterioration in at least one cooling performance of converter cooling performance and inverter cooling performance, the cooling-performance-deterioration detecting unit 16 generates the cooling performance deterioration detection signal RLD and outputs the cooling performance deterioration detection signal RLD to the operator warning unit 11 and the power-converting-circuit control unit 13. When the cooling performance deterioration detection signal RLD is input, the operator warning unit 11 notifies the user such as the operator of the deterioration in the cooling performance using a display function or a rumbling function. When the cooling performance deterioration detection signal RLD is input, the power-converting-circuit control unit 13 interrupts the output of the main circuit operation command GS and stops the operation of the inverter main circuit 2 and the converter main circuit 6.

Figure 12:
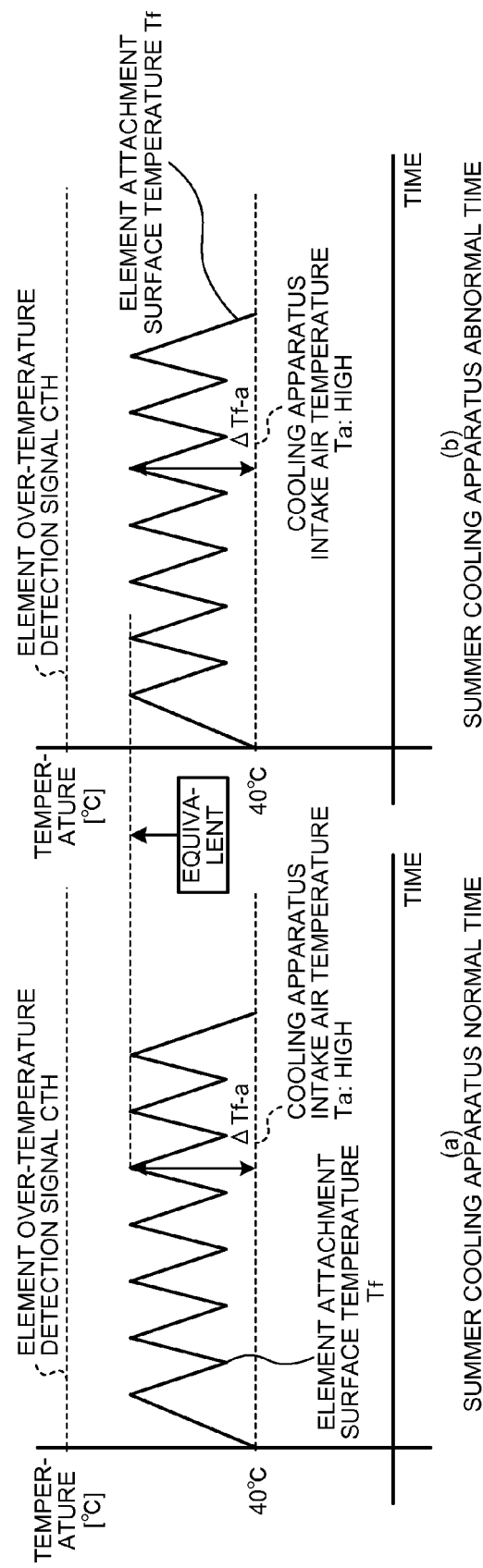
FIG. 12 is a diagram of a change in an element attachment surface temperature characteristic (at a high ambient temperature) that occurs when the air mixes inside fins.
Figure 13:
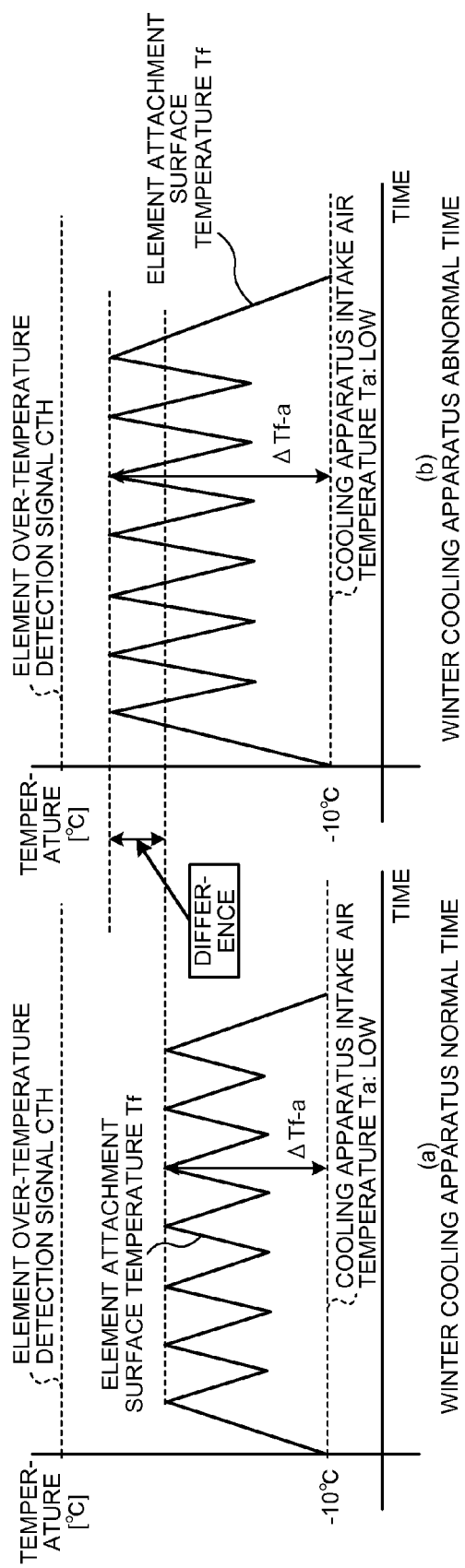
FIG. 13 is a diagram of a change in the element attachment surface temperature characteristic (at a low ambient temperature) that occurs when the air mixes inside the fins.

Effects of the power converter according to the first embodiment are explained with reference to FIG. 12 and FIG. 13. FIG. 12 and FIG. 13 are diagrams of a change in an element attachment surface temperature characteristic that occurs when the air mixes inside the fins in which the coolant is filled. More specifically, FIG. 12(a) is an example of a change in the element attachment surface temperature characteristic that occurs when there is no air mixing and the ambient temperature is high as in summer (identified as "summer cooling apparatus normal time"). FIG. 12(b) is an example of a change in the element attachment surface temperature characteristic that occurs when there is air mixing for comparison with FIG. 12(a) (identified as "summer cooling apparatus abnormal time"). FIG. 13(a) is an example of a change in the element attachment surface temperature characteristic that occurs when there is no air mixing and the ambient temperature is low as in winter (identified as "winter cooling apparatus normal time"). FIG. 13(b) is an example of a change in the element attachment surface temperature characteristic that occurs when there is air mixing for comparison with FIG. 13(b). Note that a triangular wave-like waveform shown in the figures is the heat cycle of the power converter shown in FIG. 10.

When the cooling apparatus intake air temperature is high, for example, in summer or when the heat value of the switching elements is large (the switching loss is large), as explained with reference to FIG. 9, the air mixed inside the fins is compressed (pressed) by coolant water vapor that changes from a liquid phase to a gas phase and intrudes into the fins. A difference in a deviation (a temperature difference) ΔTf–a between a maximum of the element attachment surface temperature Tf and the cooling apparatus intake air temperature Ta is small between normal time and abnormal time as shown in FIGS. 12(a) and 12(b). Therefore, when the cooling apparatus intake air temperature is high, for example, in summer, a difference in cooling performance is not so large and a probability of manifestation of deterioration in the cooling performance is small.

On the other hand, when the cooling apparatus intake air temperature is low, for example, in winter and the heat value of the switching elements is small (the switching loss is small), as explained with reference to FIG. 10, an amount of the coolant water vapor that changes from the liquid phase to the gas phase is small and the influence of the air mixed inside the fins is large. Therefore, the deviation (the temperature difference) ΔTf–a between the maximum of the element attachment surface temperature Tf and the cooling apparatus intake air temperature Ta is large between normal time and abnormal time as shown in FIGS. 13(a) and 13(b). Therefore, when the cooling apparatus intake air temperature is low, for example, in winter, the difference in the cooling performance becomes conspicuous and cooling performance deterioration is easily detected.

Note that it is also possible to detect the cooling performance deterioration using a function of the element-overtemperature detecting unit 10 for comparing the element attachment surface temperature Tf with the element over-temperature detection signal CTH. However, when the cooling apparatus intake air temperature is low, for example, in winter, a temperature difference to the element over-temperature detection signal CTH is large compared with that in summer. Therefore, when the cooling performance deterioration is not so large, the performance deterioration is overlooked. Therefore, when the switching elements are continuously used under a state in which the cooling performance deterioration is not so large, heat stress is continuously applied to the switching elements compared with heat stress applied when there is no cooling performance deterioration. This is not a preferable state.

On the other hand, as in the first embodiment, if the cooling performance deterioration is detected by comparing the element attachment surface temperature Tf with the cooling apparatus intake air temperature Ta, it is possible and easy to find the cooling performance deterioration. Therefore, with the power converter in the first embodiment, it is easy to detect the cooling performance deterioration in the cooling apparatus, which is difficult in the conventional element over-temperature detection. Because it is easy to detect the cooling performance deterioration, it is possible to improve an effect of preventing element breakage due to excessive heat stress on the switching elements.

As explained in the section of the background art, the deterioration in the cooling performance is also caused by, for example, clogging of the cooling fins. In the conventional method, in summer when the cooling apparatus intake air temperature is high, it is conceivable that, in some case, the clogging of the fins can be accidentally found by the function of the element over-temperature detection. However, it is difficult to find the clogging of the fins in winter when the cooling apparatus intake air temperature is low. On the other hand, in the power converter in the first embodiment, it is also possible to detect such deterioration in the cooling performance.

As explained above, with the power converter in the first embodiment, the cooling performance deterioration detection signal representing the performance deterioration of the cooling apparatus is generated and output when the deviation between the element attachment surface temperature and the cooling apparatus intake air temperature exceeds the predetermined threshold. The control for stopping the operation of the power converter is performed based on the cooling performance deterioration detection signal. Therefore, it is possible to effectively detect deterioration in the cooling performance due to factors such as air mixing in the condenser and clogging of the cooling fins.

Second Embodiment

Figure 14:
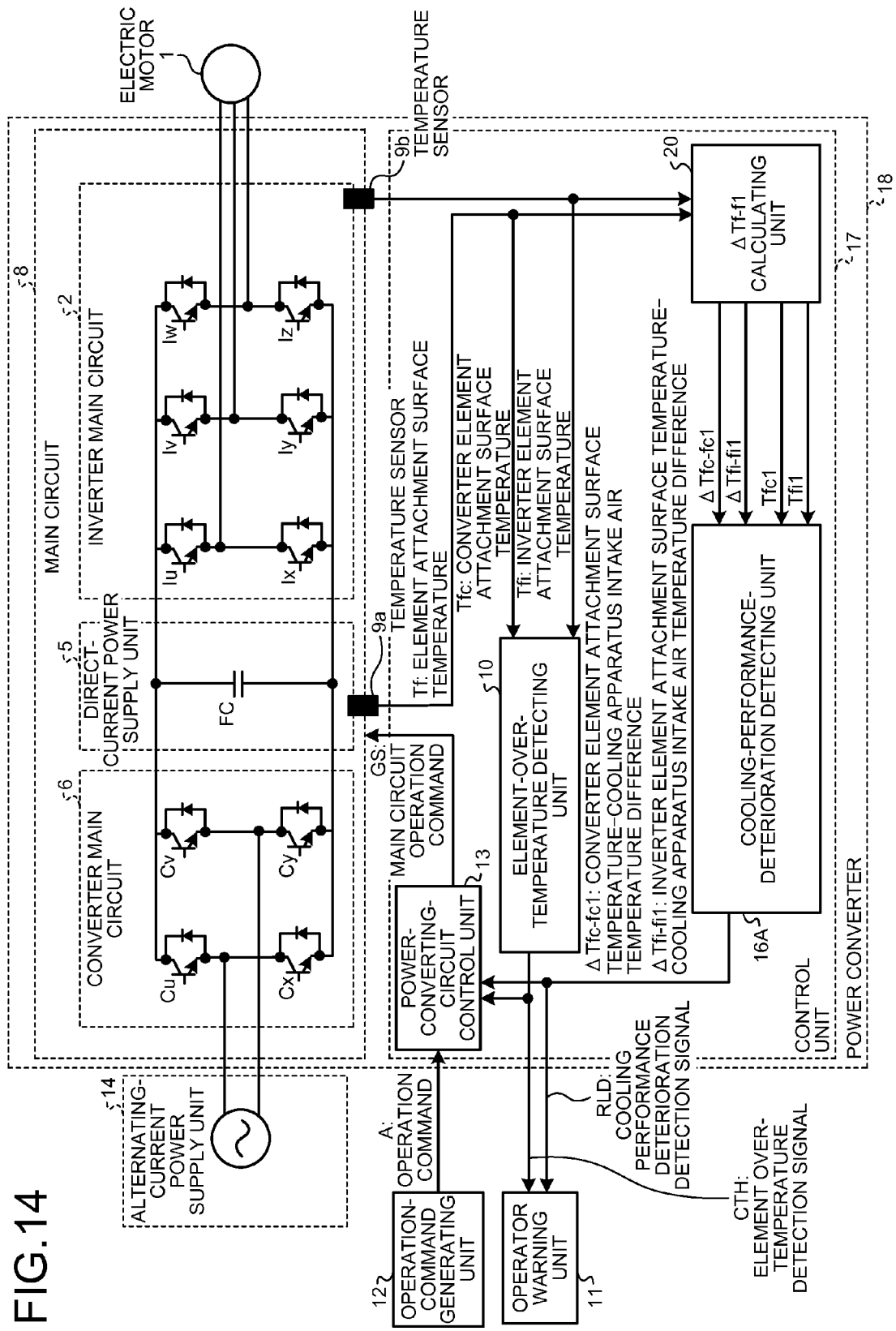
FIG. 14 is a diagram of the configuration of a power converter according to a second embodiment.

A power converter according to a second embodiment is explained. FIG. 14 is a diagram of the configuration of the power converter according to the second embodiment. In the first embodiment, the power converter is configured to detect the cooling apparatus intake air temperature Ta with the temperature sensor 9c. The second embodiment is different from the first embodiment in that the temperature sensor 9c for detecting the cooling apparatus intake air temperature Ta is not provided. Therefore, as it is evident from comparison of FIG. 2 and FIG. 14, in the power converter in the second embodiment, a $\Delta Tf$-f1 calculating unit 20 is provided instead of the $\Delta Tf$-a calculating unit 15. A cooling-performance-deterioration detecting unit 16A different in a detailed configuration from the first embodiment that operates using an output of the $\Delta Tf$-f1 calculating unit 20 as an input signal is provided. Note that the other components are the same as or equivalent to the components in the first embodiment. The components are denoted by the same reference numerals and signs and detailed explanation of the components is omitted.

Figure 15:
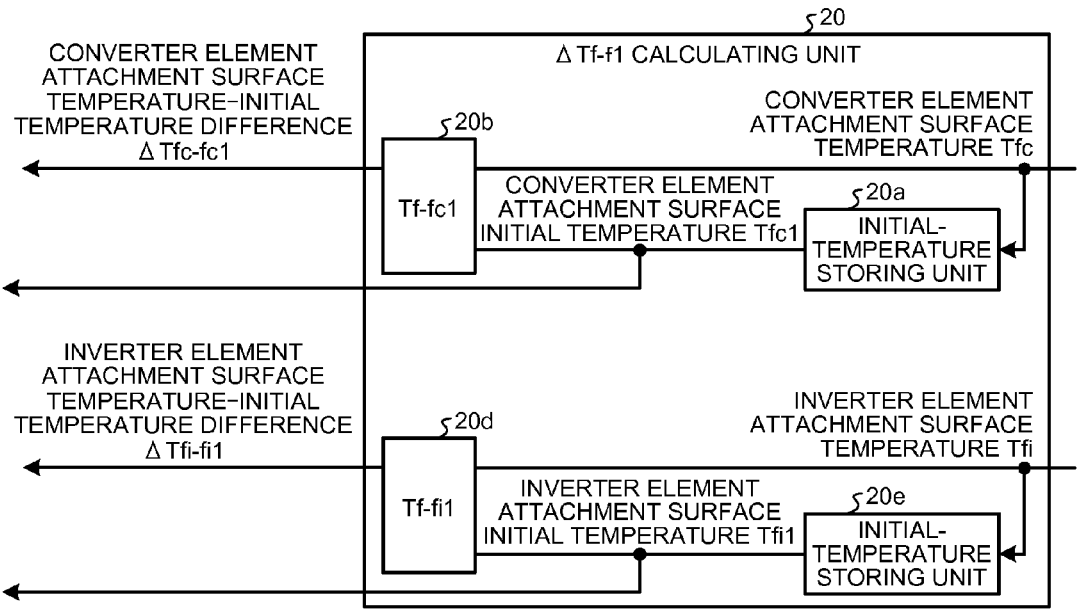
FIG. 15 is a diagram of a detailed configuration of a ΔTf–f1 calculating unit.

FIG. 15 is a diagram of a detailed configuration of the $\Delta Tf$-f1 calculating unit 20. The $\Delta Tf$-f1 calculating unit 20 includes initial-temperature storing units 20a and 20c, a calculating unit (in FIG. 15, described as "Tf-fc1") 20b configured to calculate a signal (in FIG. 15, described as "$\Delta Tfc$-fc1") representing a temperature difference on a converter main circuit side, and a calculating unit (in FIG. 15, described as "Tf-fi1") 20d configured to calculate a signal (an inverter main circuit side temperature difference signal; in FIG. 15, described as "$\Delta Tfi$-fi1") representing a temperature difference on an inverter main circuit side. The converter element attachment surface temperature Tfc and the inverter element attachment surface temperature Tfi are input to the $\Delta Tf$-f1 calculating unit 20.

The initial-temperature storing unit 20a records an initial value of the converter element attachment surface temperature Tfc (e.g., temperature before an operation start in one day) and outputs the recorded initial value to the Tf-fc1 calculating unit 20b and the outside as a converter element attachment surface initial temperature Tfc1. The Tf-fc1 calculating unit 20b calculates a difference value (a deviation) between the converter element attachment surface temperature Tfc and the converter element attachment surface initial temperature Tfc1 and outputs a result of the calculation to the outside as a converter element attachment surface temperature-initial temperature difference $\Delta Tfc$-fc1. The initial-temperature storing unit 20c stores an initial value of the inverter element attachment surface temperature Tfi and outputs the stored initial value to the Tf-fi1 calculating unit 20d and the outside as an inverter element attachment surface initial temperature Tfi1. The Tf-fi1 calculating unit 20d calculates a difference value (a difference) between the inverter element attachment surface temperature Tfi and the inverter element attachment surface initial temperature Tfi1 and outputs a result of the calculation to the outside as an inverter element attachment surface temperature-initial temperature difference $\Delta Tfi$-fi1. Note that, as shown in FIG. 14, the converter element attachment surface initial temperature Tfc1, the converter element attachment surface temperature-initial temperature difference $\Delta Tfc$-fc1, the inverter element attachment surface initial temperature Tfi1, and the inverter element attachment surface temperature-initial temperature difference $\Delta Tfi$-fi1 are input signals to the cooling-performance-deterioration detecting unit 16A.

The converter element attachment surface initial temperature Tfc1 and the inverter element attachment surface initial temperature Tfi1 are temperatures during the operation of the power converter and are retained by the initial-temperature storing units 20a and 20c. The $\Delta Tf$-f1 calculating unit 20 treats the converter element attachment surface initial temperature Tfc1 and the inverter element attachment surface initial temperature Tfi1 as temperatures equivalent to the cooling apparatus intake air temperature Ta in the control system in the first embodiment. However, when the power converter is used under an environment in which the cooling apparatus intake air temperature Ta does not greatly change, an effect is obtained that it is possible to reduce the number of temperature sensors.

Figure 16:
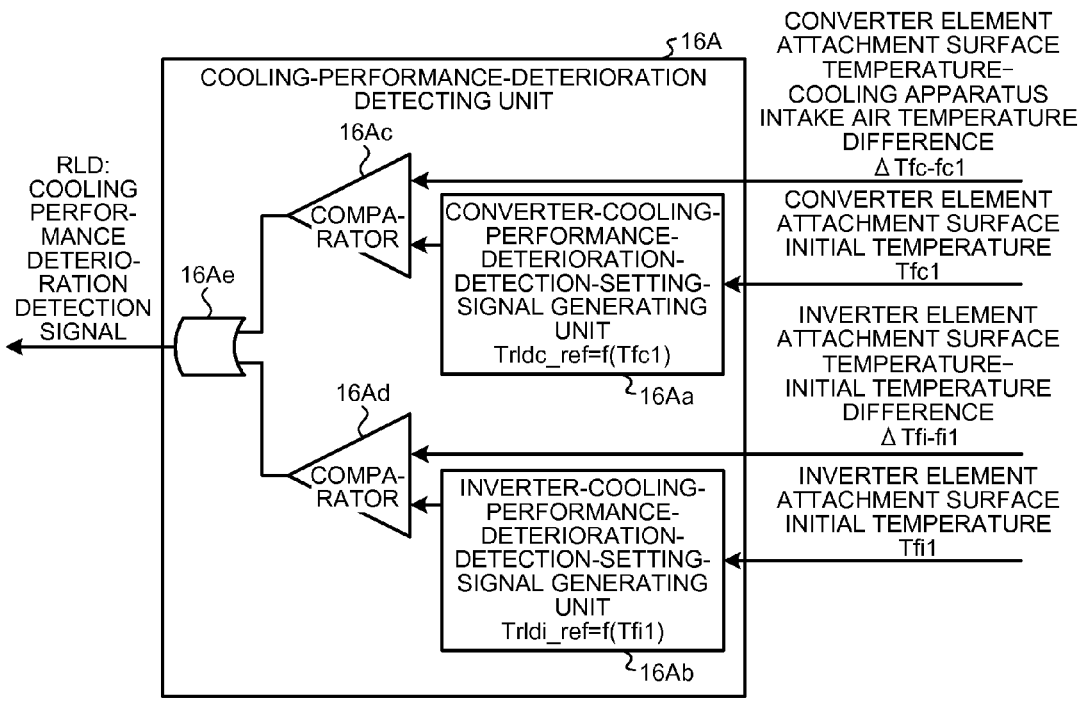
FIG. 16 is a diagram of a detailed configuration of a cooling-performance-deterioration detecting unit according to the second embodiment.

FIG. 16 is a diagram of a detailed configuration of the cooling-performance-deterioration detecting unit 16A. The cooling-performance-deterioration detecting unit 16A includes a converter-cooling-performance-deterioration-detection-setting-signal generating unit 16Aa, an inverter-cooling-performance-deterioration-detection-setting-signal generating unit 16Ab, comparators 16Ac and 16Ad, and an OR circuit 16Ae. The converter element attachment surface temperature–initial temperature difference $\Delta Tfc$–fc1, the converter element attachment surface initial temperature Tfc1, the inverter element attachment surface temperature–initial temperature difference $\Delta Tfi$–fi1, and the inverter element attachment surface initial temperature Tfi1 are input to the cooling-performance-deterioration detecting unit 16A.

The converter-cooling-performance-deterioration-detection-setting-signal generating unit 16Aa generates, based on the input converter element attachment surface initial temperature Tfc1, the converter cooling performance deterioration detection setting signal Trldc_ref and outputs the converter cooling performance deterioration detection setting signal Trldc_ref to the comparator 16Ac. Note that, in the first embodiment, the converter cooling performance deterioration detection stetting signal Trldc_ref is internally generated. However, in the second embodiment, the converter-cooling-performance-deterioration-detection-setting-signal generating unit 16Aa is configured to be capable of changing a setting signal corresponding to an input signal from the outside, that is, a peripheral environment. With this configuration, it is possible to determine the cooling performance deterioration detection setting signals Trldc_ref and Trldi_ref suitable for the cooling apparatus intake air temperature Ta. For example, when the cooling apparatus intake air temperature Ta is high, because a heat value of elements is large, a vapor quantity of a coolant increases and performance deterioration of the cooling apparatus under an air mixed state decreases. Therefore, because the influence of heat stress on converter elements is small compared with heat stress applied when the cooling apparatus intake air temperature Ta is low, when the cooling apparatus intake air temperature Ta is high, it is possible to reduce a value of the converter cooling performance deterioration detection setting signal Trldc_ref. With this control, an effect is obtained that it is possible to suppress fluctuation in the heat stress on the converter elements in an operation period of the apparatus and it is possible to attain improvement of an operating ratio of the apparatus and extension of the life of the apparatus.

Referring back to FIG. 16, when the converter element attachment surface temperature–initial temperature difference $\Delta Tfc$–fc1 exceeds the converter cooling performance deterioration detection setting signal Trldc_ref, the comparator 16Ac detects deterioration in cooling performance on the converter main circuit side and outputs a detected signal to the OR circuit 16Ae. Processing on the inverter side is the same. First, the inverter-cooling-performance-deterioration-detection-setting-signal generating unit 16Ab generates the inverter cooling performance deterioration detection setting signal Trldi_ref based on the input inverter element attachment surface initial temperature Tfi1 and outputs the inverter cooling performance deterioration detection setting signal Trldi_ref to the comparator 16Ad. When the inverter element attachment surface temperature–initial temperature difference $\Delta Tfi$–fi1 exceeds the inverter cooling performance deterioration detection setting signal Trldi_ref, the comparator 16Ad detects deterioration in cooling performance on the inverter main circuit side and outputs a detected signal to the OR circuit 16Ae. The OR circuit 16Ae performs an OR operation of the comparators 16Ac and 16Ad and outputs an operation result as the cooling performance deterioration detection signal RLD. That is, when at least one of the converter element attachment surface temperature–initial temperature difference $\Delta Tfc$–fc1 and the inverter element attachment surface temperature–initial temperature difference $\Delta Tfi$–fi1 exceeds a detection threshold, the cooling performance deterioration detection signal RLD indicating to that effect is generated and output to the power-converting-circuit control unit 13. Note that the following processing is the same as the processing in the first embodiment.

Note that, in FIG. 16, the converter cooling performance deterioration detection setting signal Trldc_ref generated on the inside of the converter-cooling-performance-deterioration-detection-setting-signal generating unit 16Aa can be calculated by a functional calculation or can be calculated by referring to a table retained on the inside. The same applies to the inverter cooling performance deterioration detection setting signal Trldi_ref generated on the inside of the inverter-cooling-performance-deterioration-detection-setting-signal generating unit 16Ab.

As explained above, with the power converter in the second embodiment, when a deviation between the temperature and the temperature before the operation start during operation of the switching elements or the switching element attachment surface exceeds the predetermined threshold, the cooling performance deterioration detection signal representing performance deterioration of the cooling apparatus is generated and output. The control for stopping the operation of the power converter is performed based on the cooling performance deterioration detection signal. Therefore, it is possible to effectively detect deterioration in the cooling performance due to factors such as air mixing in the condenser and clogging of the cooling fins.

Third Embodiment

Figure 17:
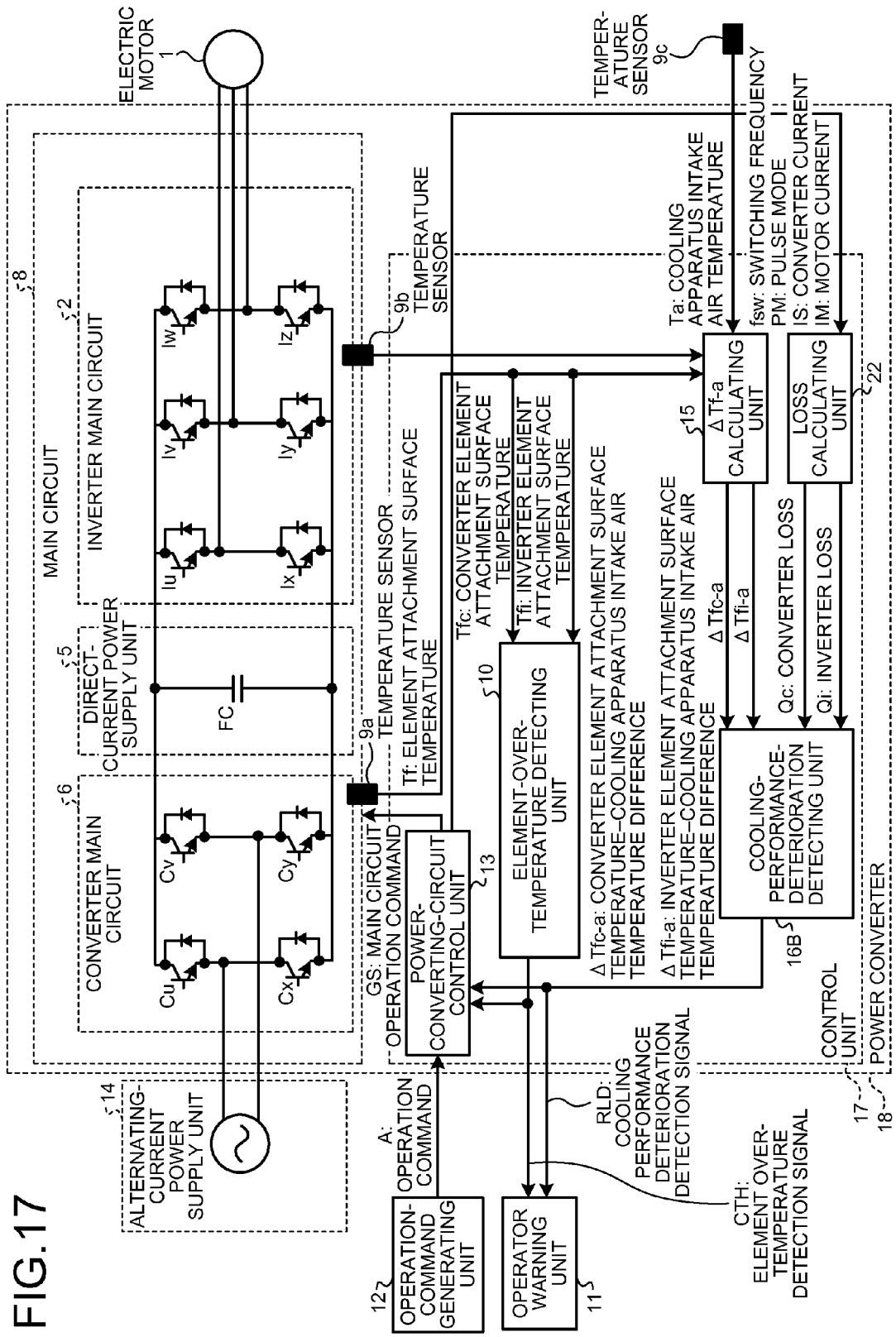
FIG. 17 is a diagram of the configuration of a power converter according to a third embodiment.

A power converter according to a third embodiment is explained. FIG. 17 is a diagram of the configuration of the power converting apparatus according to the third embodiment. In the first embodiment, the power converter is configured to input the converter element attachment surface temperature-cooling apparatus intake air temperature difference $\Delta Tfc$–a, the inverter element attachment surface temperature-cooling apparatus intake air temperature difference $\Delta Tfi$–a, and the cooling apparatus intake air temperature Ta to the cooling-performance-deterioration detecting unit 16. However, in the third embodiment, the power converter is configured to input a converter loss Qc and an inverter loss Qi generated by a loss calculating unit 22 instead of the cooling-apparatus intake air temperature Ta. That is, in the power converter in the third embodiment, the loss calculating unit 22 is provided and a cooling-performance-deterioration detecting unit 16B different in a detailed configuration from the first embodiment that operates using an output of the $\Delta Tf$–a calculating unit 15 and an output of the loss calculating unit 22 as input signals is provided. Note that the other components are the same as or equivalent to the components in the first embodiment. The components are denoted by the same reference numerals and signs and detailed explanation of the components is omitted.

Figure 18:
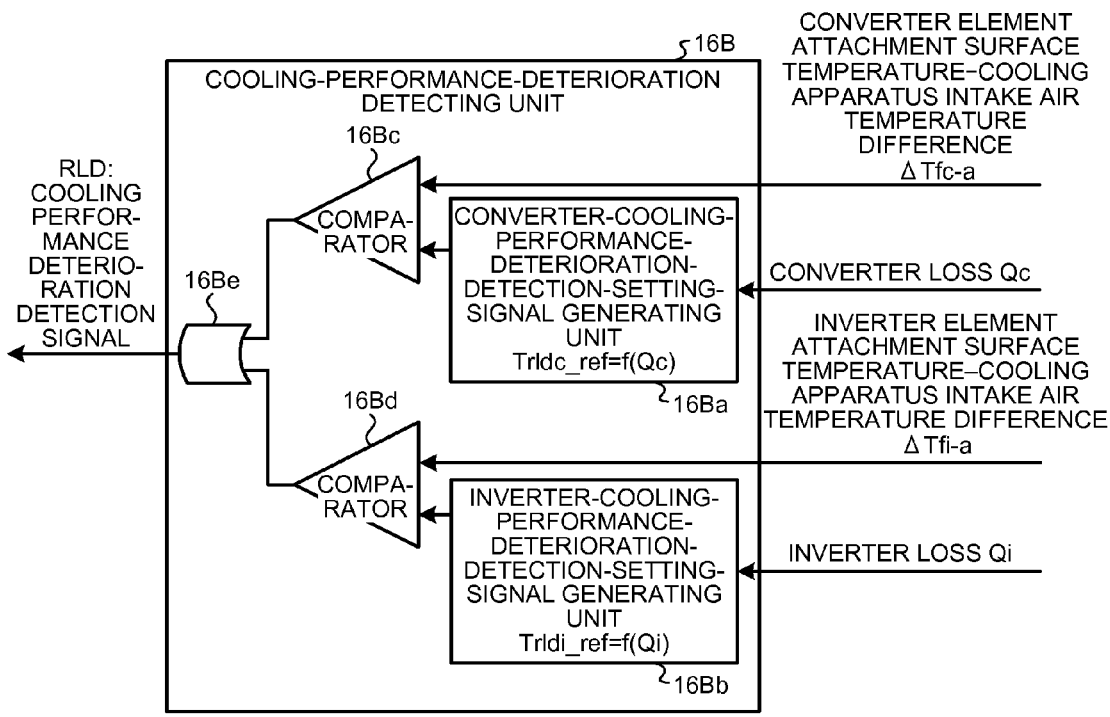
FIG. 18 is a diagram of a detailed configuration of a cooling-performance-deterioration detecting unit according to the third embodiment.

FIG. 18 is a diagram of a detailed configuration of the cooling-performance-deterioration detecting unit 16B. The cooling-performance-deterioration detecting unit 16B includes a converter-cooling-performance-deterioration-detection-setting-signal generating unit 16Ba, an inverter-cooling-performance-deterioration-detection-setting-signal generating unit 16Bb, comparators 16Bc and 16Bd, and an OR circuit 16Be. The converter element attachment surface temperature-cooling apparatus intake air temperature difference $\Delta Tfc$–a, the converter loss Qc, the inverter element attachment surface temperature-cooling apparatus intake air temperature difference ΔTfi–a, and the inverter loss Qi are input to the cooling-performance-deterioration detecting unit 16B.

The converter-cooling-performance-deterioration-detection-setting-signal generating unit 16Ba generates, based on the input converter loss Qc, the converter cooling performance deterioration detection setting signal Trldc_ref and outputs the converter cooling performance deterioration detection setting signal Trldc_ref to the comparator 16Bc. Note that, in the first embodiment, the converter cooling performance deterioration detection stetting signal Trldc_ref is internally generated. However, in the third embodiment, the converter-cooling-performance-deterioration-detection-setting-signal generating unit 16Ba is configured to be capable of changing a setting signal corresponding to converter loss Qc. With this configuration, it is possible to determine the converter cooling performance deterioration detection setting signal Trldc_ref corresponding to the converter loss Qc. For example, when the converter loss Qc is large, because a heat value of elements is large, a vapor quantity of a coolant increases and performance deterioration of the cooling apparatus under an air mixed state decreases. However, the ΔTfc–a does not increase in proportion to the converter loss Qc. ΔTfc–a has a characteristic corresponding to a cooler. Therefore, it is preferable to set a threshold to a threshold having characteristics of the converter loss Qc and ΔTfc–a. With such processing, an effect is obtained that it is possible to suppress fluctuation in the heat stress on the converter elements in an operation period of the apparatus and it is possible to attain improvement of an operating ratio of the apparatus and extension of the life of the apparatus.

Referring back to FIG. 18, when the converter element attachment surface temperature-cooling apparatus intake air temperature difference ΔTfc–a exceeds the converter cooling performance deterioration detection setting signal Trldc_ref, the comparator 16Bc detects deterioration in cooling performance on the converter main circuit side and outputs a detected signal to the OR circuit 16Be. Processing on the inverter side is the same. First, the inverter-cooling-performance-deterioration-detection-setting-signal generating unit 16Bb generates the inverter cooling performance deterioration detection setting signal Trldi_ref based on the input inverter loss Qi and outputs the inverter cooling performance deterioration detection setting signal Trldi_ref to the comparator 16Bd. That is, in the configuration in the third embodiment, the inverter-cooling-performance-deterioration-detection-setting-signal generating unit 16Bb is configured to be capable of changing a setting signal corresponding to the inverter loss Qi. With this configuration, it is possible to determine the inverter cooling performance deterioration detection setting signal Trldi_ref corresponding to the inverter loss Qi. When the inverter element attachment surface temperature-cooling apparatus intake air temperature difference ΔTfi–a exceeds the inverter cooling performance deterioration detection setting signal Trldi_ref, the comparator 16Bd detects deterioration in cooling performance on the inverter main circuit side and outputs a detected signal to the OR circuit 16Be. The OR circuit 16Be performs an OR operation of the comparators 16Bc and 16Bd and outputs an operation result as the cooling performance deterioration detection signal RLD. That is, when at least one of the converter element attachment surface temperature-cooling apparatus intake air temperature difference ΔTfc–a and the inverter element attachment surface temperature-cooling apparatus intake air temperature difference ΔTfi–a exceeds a detection threshold, the cooling performance deterioration detection signal RLD indicating to that effect is generated and output to the power-converting-circuit control unit 13. Note that the following processing is the same as the processing in the first embodiment.

Figure 19:
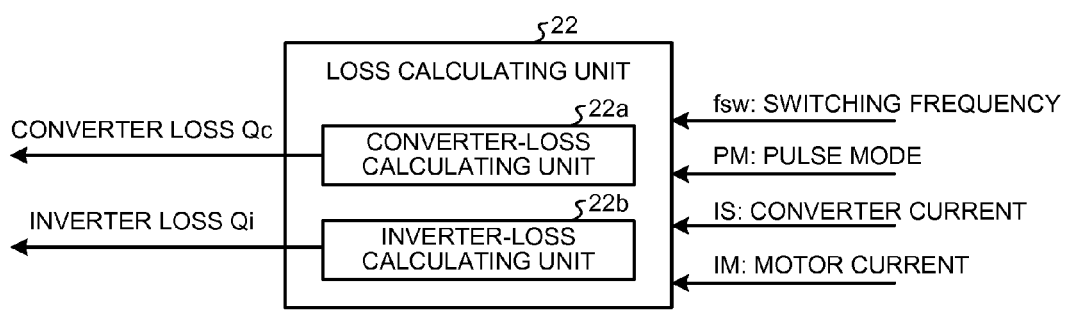
FIG. 19 is a diagram of a detailed configuration of a loss calculating unit.

FIG. 19 is a diagram of a detailed configuration of the loss calculating unit 22. The loss calculating unit 22 includes a converter-loss calculating unit 22a configured to calculate the converter loss Qc and an inverter-loss calculating unit 22b configured to calculate the inverter loss Qi. The switching frequency fsw, the pulse mode PM, the converter current IS, and the motor current IM generated by the power-converting-circuit control unit 13 are input to the loss calculating unit 22. The converter-loss calculating unit 22a calculates, using the switching frequency fsw, the pulse mode PM, the converter current IS, and the motor current IM, the converter loss Qc representing a loss amount of the converter main circuit 6 and outputs the converter loss Qc to the cooling-performance-deterioration detecting unit 16B. The inverter-loss calculating unit 22b calculates, using the switching frequency fsw, the pulse mode PM, the converter current IS, and the motor current IM, the inverter loss Qi representing a loss amount of the inverter main circuit 2 and outputs the inverter loss Qi to the cooling-performance-deterioration detecting unit 16B. Note that a calculation method for the converter loss Qc and the inverter loss Qi is publicly known. Therefore, detailed explanation of the calculation method is omitted.

Note that, in FIG. 18, the converter cooling performance deterioration detection setting signal Trldc_ref generated on the inside of the converter-cooling-performance-deterioration-detection-setting-signal generating unit 16Ba can be calculated by a functional calculation or can be calculated by referring to a table retained on the inside. The same applies to the inverter cooling performance deterioration detection setting signal Trldi_ref generated on the inside of the inverter-cooling-performance-deterioration-detection-setting-signal generating unit 16Bb.

As explained above, with the power converter in the third embodiment, when the control for stopping the operation of the power converter is performed when a deviation between the element attachment surface temperature and the cooling apparatus intake air temperature exceeds the predetermined threshold, the threshold is changed based on a loss of the switching elements. Therefore, it is possible to suppress fluctuation in the heat stress on the switching elements and attain improvement of an operating ratio of the apparatus and extension of the life of the apparatus.

Note that, concerning the configurations and the control forms explained in the first to third embodiments, various changes or modifications are possible. For example, in the first embodiment, the converter cooling performance deterioration detection setting signal Trldc_ref and the inverter cooling performance deterioration detection setting signal Trldi_ref, which are the thresholds for detecting deterioration in the cooling performance are explained as the function (f(Ta)) of the cooling apparatus intake air temperature Ta. However, if values of the thresholds themselves are dynamically changed based on the temperature of cooling air, it is possible to effectively perform cooling performance deterioration detection. Specifically, it is preferable that the thresholds are generated to be smaller when the temperature of the cooling air is high than when the temperature of the cooling air is low. The performance of the cooling apparatus is higher when the temperature of the cooling air is high than when the temperature of the cooling air is low. This is because the vapor quantity of the coolant is larger when the temperature of the cooling air is high. This means that it is possible to grasp true cooling performance better when the temperature of the cooling air is low than when the temperature of the cooling air is high. From this viewpoint, when the temperature of the cooling air is high, it is possible to accurately grasp the true cooling performance by setting the thresholds small.

In the third embodiment, the converter performance deterioration detection setting signal Trldc_ref, which is the threshold for detecting deterioration in the cooling performance, is explained as the function (f(Qc)) of the converter loss Qc. The inverter cooling performance deterioration detection setting signal Trldi_ref, which is the threshold for detecting deterioration in the cooling performance, is explained as the function (f(Qi)) of the inverter loss Qi. However, if values of the thresholds themselves are dynamically changed based on the converter loss Qc and the inverter loss Qi, it is possible to effectively perform the cooling performance deterioration detection. The performance of the cooling apparatus is higher when the converter loss Qc (the inverter loss Qi) is large than when the converter loss Qc (the inverter loss Qi) is small. This is because the vapor quantity of the coolant is larger when the converter loss Qc (the inverter loss Qi) is large. Therefore, $\Delta Tf$–a does not increase in proportion to the converter loss Qc (the inverter loss Qi). $\Delta Tf$–a has a characteristic corresponding to the cooler. It is preferable to use thresholds having characteristics of the converter loss Qc (the inverter loss Qi) and $\Delta Tf$–a as the thresholds. From this viewpoint, it is possible to accurately grasp the true cooling performance by using the thresholds having characteristics of the converter loss Qc (the inverter loss Qi) and $\Delta Tf$–a as the thresholds.

In the configurations in the first to third embodiments, a more preferable implementation form is obtained if a calendar function is imparted to the cooling-performance-deterioration detecting unit 16 (16A and 16B), outdoor temperature is predicted based on season information by the calendar function, and, when the predicted outdoor temperature is high, a function for changing the thresholds to be smaller is imparted to the cooling-performance-deterioration detecting unit 16 (16A and 16B). According to this implementation form, as explained above, it is possible to accurately grasp the true cooling performance.

In the configurations in the first to third embodiments, it is a more preferable implementation form to perform, when the deviation exceeds the predetermined threshold, control for reducing a switching frequency for causing the switching elements to operate. In a process for stopping the apparatus, it is possible to reduce the heat value of the switching elements if control for reducing the switching frequency is performed rather than immediately stopping the apparatus. For example, in a power converter for railway car use, it is possible to continue a service to a nearest station or a rail yard.

In the configurations in the first to third embodiments, it is a more preferable implementation form to perform, when the deviation exceeds the predetermined threshold, control for limiting an electric current fed to the switching elements. As explained above, in the process for stopping the apparatus, it is possible to reduce the heat value of the switching elements if the control for reducing the switching frequency is performed rather than immediately stopping the apparatus. For example, in the power converter for railway car use, it is possible to continue a service to a nearest station or a rail yard.

Fourth Embodiment

In a fourth embodiment, a switching element included in an inverter main circuit and a converter main circuit is explained. As a switching element used in a power converter, a switching element is generally used that has a configuration in which a semiconductor transistor element (an IGBT, a MOSFET, etc.) formed using silicon (Si) as a material and a diode element also formed using silicon as a material are connected in inverse parallel to each other. The technologies explained in the first and second embodiments can be used for an inverter main circuit and a converter main circuit including the general switching element.

On the other hand, the technologies in the first to fourth embodiments are not limited to the switching element formed using silicon as a material. It is naturally possible to use the technologies for an inverter main circuit and a converter main circuit including a switching element formed using silicon carbide (SiC), which attracts attention in recent years, as a material.

The silicon carbide has a characteristic that the silicon carbide can be used at high temperature. Therefore, if a switching element formed using the silicon carbide as a material is used as the switching element included in the inverter main circuit or the converter main circuit, it is possible to reduce a switching loss of a semiconductor module mounted with the switching element. Therefore, when the switching element formed using the silicon carbide as a material is used, because the switching loss decreases, a cooling apparatus tends to fall into a boiling unstable region. However, in the present invention, even when the cooling apparatus transitions to the boiling unstable region, it is possible to increase the switching loss and prevent the switching element from entering the boiling unstable region.

Note that, judging from a characteristic that a band gap of the silicon carbide (SiC) is larger than a band gap of silicon (Si), the silicon carbide is an example of a semiconductor called wide band gap semiconductor. Besides the silicon carbide, a semiconductor formed using, for example, a gallium nitride material or diamond also belongs to the wide band gap semiconductor. Characteristics of the semiconductors have many similarities. Therefore, configurations in which wide band gap semiconductors other than the silicon carbide are used also constitute the gist of the present invention.

A transistor element and a diode element formed of such a wide band gap semiconductor have high withstand voltage properties and high allowable current density. Therefore, it is possible to reduce the size of the transistor element and the diode element. By using the transistor element and the diode element reduced in the size, it is possible to reduce the size of a semiconductor module incorporating the elements.

The transistor element and the diode element formed of the wide band gap semiconductor has high heat resistance as well. Therefore, it is possible to reduce the size of heat radiation fins of a heat sink and further reduce the size of the semiconductor module.

Further, the transistor element and the diode element formed of the wide band gap semiconductor have a low power loss. Therefore, it is possible to improve efficiency of the switching element and the diode element. Further, it is possible to improve efficiency of the semiconductor module.

Note that it is desirable that both of the switching element and the diode element are formed of the wide band gap semiconductor. However, one of the elements can be formed of the wide band gap semiconductor. It is possible to obtain the effects described in the embodiments.

INDUSTRIAL APPLICABILITY

As explained above, the power converter according to the present invention is useful as an invention capable of effectively detecting cooling performance deterioration due to factors other than air mixing in a condenser in a boiling cooling apparatus.

REFERENCE SIGNS LIST

1 Electric motor
2 Inverter main circuit
5 Direct-current power supply unit
6 Converter main circuit
8 Main circuit
9a, 9b, 9c Temperature sensors
10 Element-over-temperature detecting unit
10a, 10b Comparators
10c OR circuit
11 Operator warning unit
11a Display unit
11b Rumbling unit
12 Operation-command generating unit
12a Power running/brake selecting unit
13 Power-conversion-circuit control unit
13a Current-command calculating unit
13b Voltage-command generating unit
13c Main-circuit-operation-command generating unit
13ca Modulation-wave generating unit
13cb Carrier-wave generating unit
13cc Comparator
14 Alternating-current power supply unit
15 $\Delta Tf$–a calculating unit (temperature-difference calculating unit)
15a Tfc–Ta calculating unit
15b Tfi–Ta calculating unit
16 Cooling-performance-deterioration detecting unit
16a, 16b Comparators
16c OR circuit
16A Cooling-performance-deterioration detecting unit
16Aa Converter-cooling-performance-deterioration-detection-setting-signal generating unit
16Ab Inverter-cooling-performance-deterioration-detection-setting-signal generating unit
16Ac, 16Ad Comparators
16Ae OR circuit
16B Cooling-performance-deterioration detecting unit
16Ba Converter-cooling-performance-deterioration-detection-setting-signal generating unit
16Bb Inverter-cooling-performance-deterioration-detection-setting-signal generating unit
16Bc, 16Bd Comparators
16Be OR circuit
17 Control unit
18 Power converter
20 $\Delta Tf$–f1 calculating unit
20a, 20c Initial-temperature storing units
20b Tf–fc1 calculating unit
20d Tf–fi1 calculating unit
22 Loss calculating unit
22a Converter-loss calculating unit
22b Inverter-loss calculating unit
50 Cooling apparatus
52 Condenser
53 Evaporator
54 Coolant
55 Fins
56a, 56b Coolant chambers
57 Switching elements
58 Cooling air
59 Hot air
60 Attachment surface

The invention claimed is:

1. A power converter converting input direct-current power or alternating-current power into desired alternating-current power according to a switching operation of a switching element to output the desired alternating-current power, and performing cooling of the switching element by using a cooling apparatus that makes use of a boiling phenomenon of a coolant incorporated therein, the power converter comprising:
a control unit controlling an operation of the power converter based on a deviation between a temperature of the switching element or an attachment surface of the switching element and a temperature of cooling air sucked by the cooling apparatus,
wherein the control unit includes a detecting unit generating and outputting a cooling performance deterioration detection signal representing performance deterioration of the cooling apparatus when the deviation exceeds a predetermined threshold.

2. The power converter according to claim 1,
wherein the detecting unit includes a threshold generating unit generating the threshold based on temperature of the cooling air, and
wherein the threshold generating unit generates the threshold that is smaller when the temperature of the cooling air is high than when the temperature of the cooling air is low.

3. The power converter according to claim 1,
wherein the detecting unit includes a threshold generating unit generating the threshold based on a loss of the switching element, and
wherein the threshold generating unit generates the threshold that is smaller when the loss of the switching element is large than when the loss of the switching element is small.

4. The power converter according to claim 1,
wherein the detecting unit includes a threshold generating unit including a calendar function and configured to generate the threshold based on season information by the calendar function, and
wherein the threshold generating unit generates the threshold that is smaller when outdoor temperature predicted based on the season information is high than when the outdoor temperature is low.

5. The power converter according to claim 1, wherein the control unit performs control of stopping the power converter when the deviation exceeds the predetermined threshold.

6. The power converter according to claim 1, wherein, when the deviation exceeds the predetermined threshold, the control unit performs control of reducing a switching frequency for causing the switching element to operate.

7. The power converter according to claim 1, wherein, when the deviation exceeds the predetermined threshold, the control unit performs control of limiting an electric current applied to the switching element.

8. The power converter according to claim 1, wherein at least one of a transistor element and a diode element included in the switching element is formed of a wide band gap semiconductor.

9. The power converter according to claim 8, wherein the wide band gap semiconductor is a semiconductor formed using silicon carbide, a gallium nitride material, or diamond.

10. A power converter according to claim 1, wherein the control unit controls an operation of the power converter based on the cooling performance deterioration detection signal.

11. A power converter converting input direct-current power or alternating-current power into desired alternating-current power according to a switching operation of a switching element to output the desired alternating-current power, and perform cooling of the switching element by using a cooling apparatus that makes use of a boiling phenomenon of a coolant incorporated therein, the power converter comprising:
- a control unit controlling an operation of the power converter based on a deviation between a temperature during operation and a temperature before an operation start of the switching element or an attachment surface of the switching element,
- wherein the control unit includes a detecting unit generating and outputting a cooling performance deterioration detection signal representing performance deterioration of the cooling apparatus when the deviation exceeds a predetermined threshold, and
- wherein the detecting unit includes a threshold generating unit that generates the threshold based on a loss of the switching element such that the threshold is smaller when the loss of the switching element is large than when the loss of the switching element is small.

12. The power converter according to claim 11, wherein the control unit performs control of stopping the power converter when the deviation exceeds the predetermined threshold.

13. The power converter according to claim 11, wherein, when the deviation exceeds the predetermined threshold, the control unit performs control of reducing a switching frequency for causing the switching element to operate.

14. The power converter according to claim 11, wherein, when the deviation exceeds the predetermined threshold, the control unit performs control of limiting an electric current applied to the switching element.

15. The power converter according to claim 11, wherein at least one of a transistor element and a diode element included in the switching element is formed of a wide band gap semiconductor.

16. The power converter according to claim 15, wherein the wide band gap semiconductor is a semiconductor formed using silicon carbide, a gallium nitride material, or diamond.

17. A power converter according to claim 11, wherein the control unit controls an operation of the power converter based on the cooling performance deterioration detection signal.

* * * * *